US009484197B2

(12) United States Patent
Quitoriano

(10) Patent No.: US 9,484,197 B2
(45) Date of Patent: Nov. 1, 2016

(54) LATERAL GROWTH SEMICONDUCTOR METHOD AND DEVICES

(75) Inventor: Nathaniel Quitoriano, Montreal (CA)

(73) Assignee: The Royal Institution for the Advancement of Learning/McGill University, Montreal, Quebec (CA)

( * ) Notice: Subject to any disclaimer, the term of this patent is extended or adjusted under 35 U.S.C. 154(b) by 0 days.

(21) Appl. No.: 12/910,055

(22) Filed: Oct. 22, 2010

(65) Prior Publication Data
US 2011/0095291 A1    Apr. 28, 2011

Related U.S. Application Data

(60) Provisional application No. 61/254,332, filed on Oct. 23, 2009, provisional application No. 61/319,435, filed on Mar. 31, 2010.

(51) Int. Cl.
| | | |
|---|---|---|
| *H01L 29/04* | (2006.01) | |
| *H01L 21/02* | (2006.01) | |
| *C30B 25/02* | (2006.01) | |
| *C30B 29/08* | (2006.01) | |
| *H01L 31/18* | (2006.01) | |
| *H01L 27/15* | (2006.01) | |

(52) U.S. Cl.
CPC ......... *H01L 21/02422* (2013.01); *C30B 25/02* (2013.01); *C30B 29/08* (2013.01); *H01L 21/02532* (2013.01); *H01L 21/02639* (2013.01); *H01L 21/02653* (2013.01); *H01L 31/1804* (2013.01); *H01L 27/153* (2013.01); *Y02E 10/547* (2013.01); *Y02P 70/521* (2015.11)

(58) Field of Classification Search
USPC .................................. 438/481; 257/E21.09
See application file for complete search history.

(56) References Cited

U.S. PATENT DOCUMENTS

| | | | |
|---|---|---|---|
| 7,208,094 B2 | 4/2007 | Islam et al. | |
| 2004/0180477 A1* | 9/2004 | Zhang et al. | ................. 438/149 |
| 2008/0001169 A1* | 1/2008 | Lochtefeld | .................... 257/190 |
| 2010/0216277 A1 | 8/2010 | Fiorenza | |
| 2011/0121434 A1* | 5/2011 | Li et al. | ....................... 257/627 |

FOREIGN PATENT DOCUMENTS

WO        2010033813 A3    6/2010

OTHER PUBLICATIONS

Quitoriano et al. "Guiding vapor-liquid-solid nanowire growth using SiO2" Mar. 17, 2009 IOP Publishing Nanotechnology 20 (2009) 145303 (7pp).*

(Continued)

*Primary Examiner* — Shaun Campbell
(74) *Attorney, Agent, or Firm* — Rosenberg, Klein & Lee

(57) ABSTRACT

A method of growing high quality crystalline films on lattice-mismatched or amorphous layers is presented allowing semiconductor materials that would normally be subject to high stress and cracking to be employed allowing cost reductions and/or performance improvements in devices to be obtained. Catalysis of the growth of these films is based upon utilizing particular combinations of metals, materials, and structures to establish growth of the crystalline film from a predetermined location. The subsequent film growth occurring in one or two dimensions to cover a predetermined area of the amorphous or lattice-mismatched substrate. Accordingly the technique can be used to either cover a large area or provide tiles of crystalline material with or without crystalline film interconnections.

29 Claims, 19 Drawing Sheets

(56) References Cited

OTHER PUBLICATIONS

J.F. Geisz "Optimized Triple-Junction Solar Cells using Inverted Metamorphic Approach" (5th International Conference on Solar Concentrators for the Generation of Electricity, Palm Desert, CA • Nov. 16-19, 2008).

C.V. Thompson "Structure Evolution During Processing of Polycrystalline Films" (Annu. Rev. Mater. Sci. 2000 30:159-190.

Z. Fan et al "Wafer-Scale Assembly of Semiconductor Nanowire Arrays by Contact Printing" (Nano Lett., 2008, 8 (1), pp. 20-25).

G. Fortuna et al "Metal-Catalyzed Semiconductor Nanowires: A Review on the Control of Growth Directions" (Semicond. Sci. Technol. 25 (2010) 024005 (16pp)).

N.P. Kobayashi et al "Epitaxial Lateral Overgrowth of GaN over AlOx Surface Formed on Si Substrate" (Applied Physics Letters, vol. 74, No. 19, pp. 2836-2838).

Quitoriano et al., "Relaxed High Quality InP on GaAs by using InGaAs and InGaP Graded Buffers to Avoid Phase Separation", J. Applied Physics, Aug. 2007, vol. 102, No. 3, pp. 033511-033511-17, American Institute of Physics.

Quitoriano et al., "Integratable Nanowire Trasistors", ACS Nano Letters, Nov. 2008, vol. 8, No. 12, pp. 4410-4414, American Chemical Society.

Saif Islam et al., "Ultrahigh-Density Silicon Nano-Bridges formed between Two Vertical Silicon Surfaces," Nanotechnology, Jan. 2004, vol. 15, No. 5, pp. L5-L8, Institute of Physics.

Saif Islam et al, "A Novel Interconnection Technique for Manufacturing Nanowire Devices," Applied Physics A, Mar. 2005, vol. 80, No. 6, pp. 1133-1140, Springer-Link.

Sharma et al., "Structural Characteristics and Connection Mechanism of Gold-Catalyzed Bridging Silicon Nanowires", Journal of Crystal Growth, May 2005, vol. 280, pp. 562-568, Elsevier Publishing.

Kamins, "Beyond CMOS Electronics: Self-Assembled Nanostructures" ECS Interface, Spring 2005, pp. 46-49, The Electrochemical Society.

Kamins et al., "Metal-Catalyzed, Bridging Nanowires as Vapour Sensors and Concept for their Use in a Sensor System," Nanotechnology, May 2006, vol. 17, No. 11, pp. S291-S297, Institute of Physics.

Yi et al., "InP Nanobridges Epitaxially Formed between Two Vertical Si Surfaces by Metal-Catalyzed Chemical Vapor Deposition," Applied Physics Letters, Sep. 2006, Applied Physics Letters, vol. 89, pp. 133121-133121-3, American Institute of Physics.

T. I. Kamins, S. Sharma, and M. Saif Islam, "Self-assembled semiconductor nanowires on silicon and insulating substrates: Experimental behavior," Science and Technology of Semiconductor-on-Insulator Structures and Devices Operating in a Harsh Environment, D. Flandre, et al (eds), (Kluwer Academic Publishers, 2005), pp. 327-332.

Kamins, "Beyond CMOS Electronics: Self-Assembled Nanostructures", Springer Series in Materials Science "Into the Nano Era", 2009, vol. 106, Ch. 9, pp. 227-256, Springer Link.

\* cited by examiner

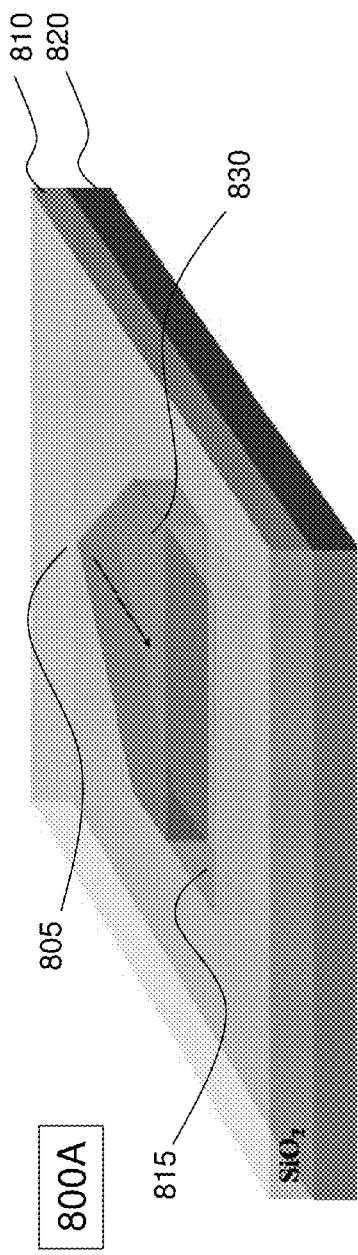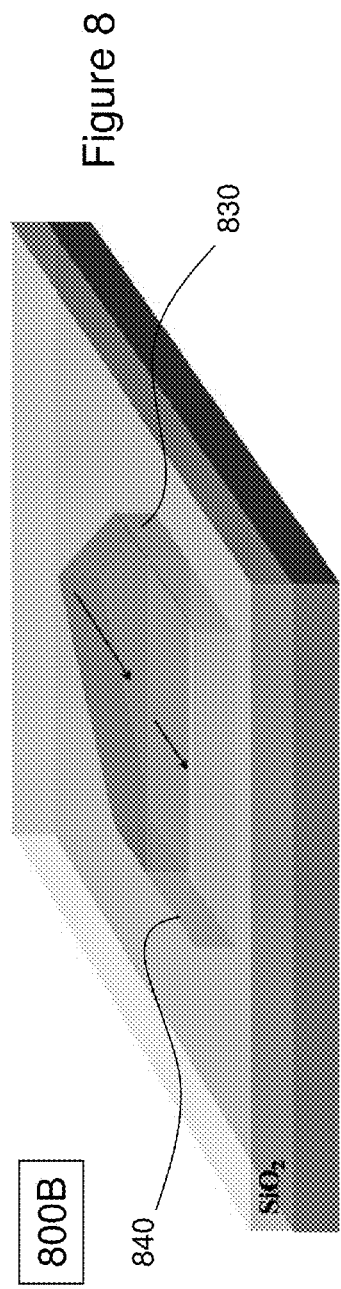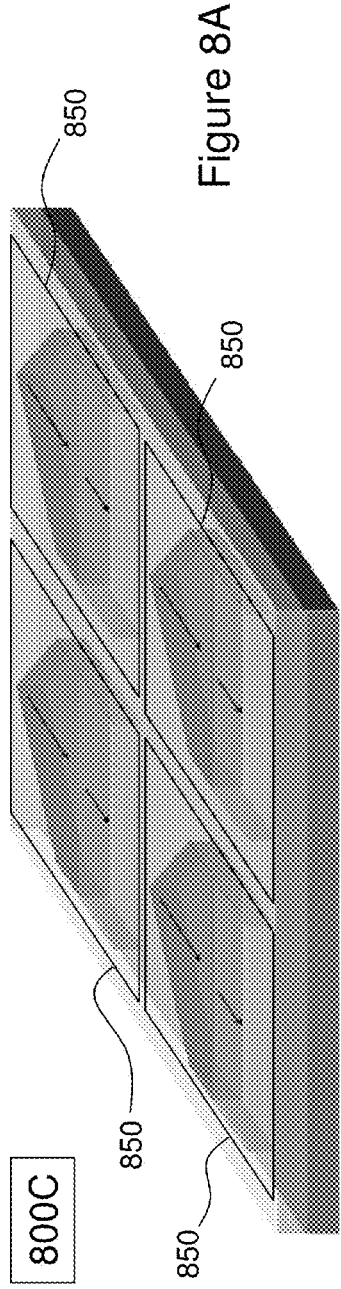
Figure 8   Figure 8A

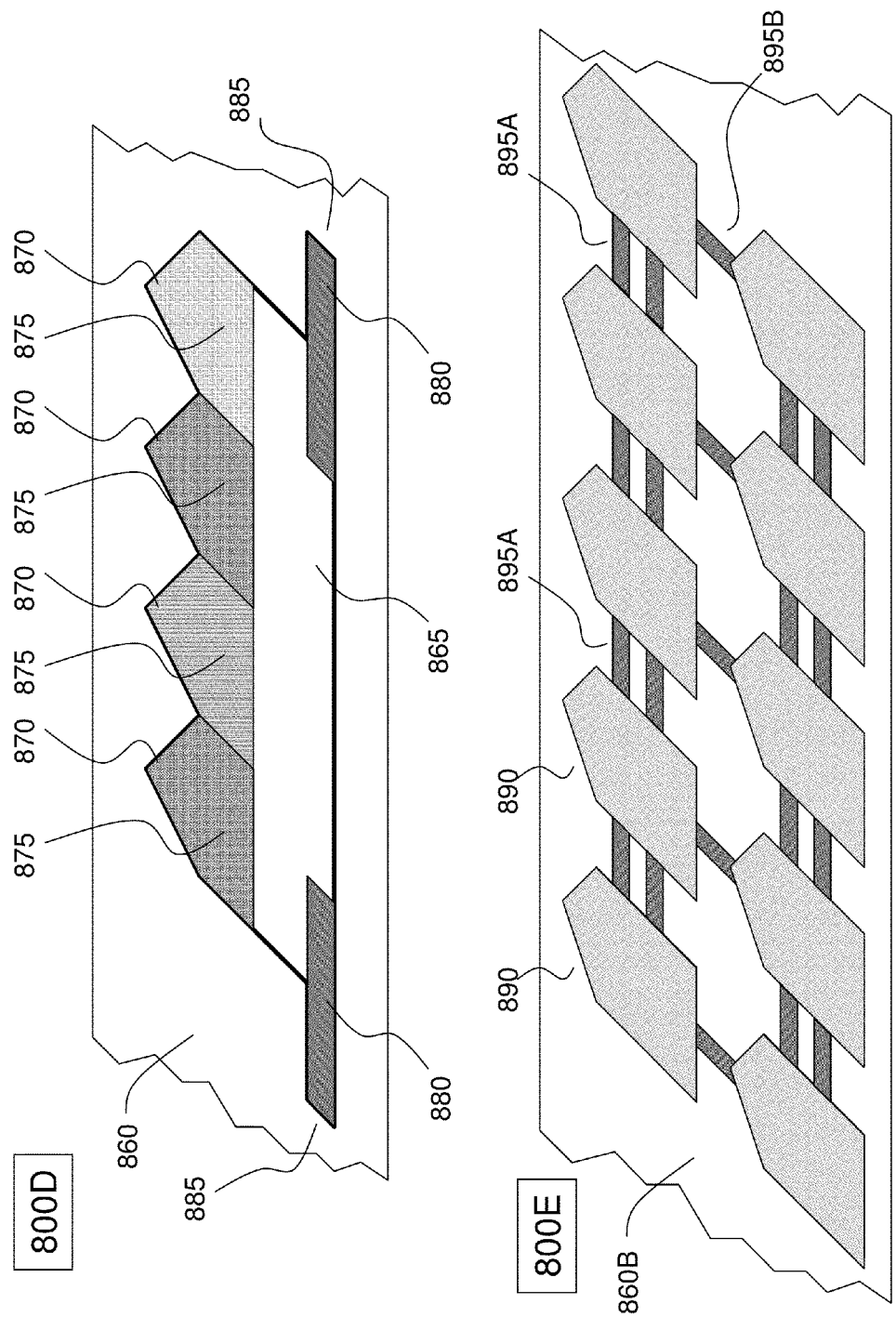

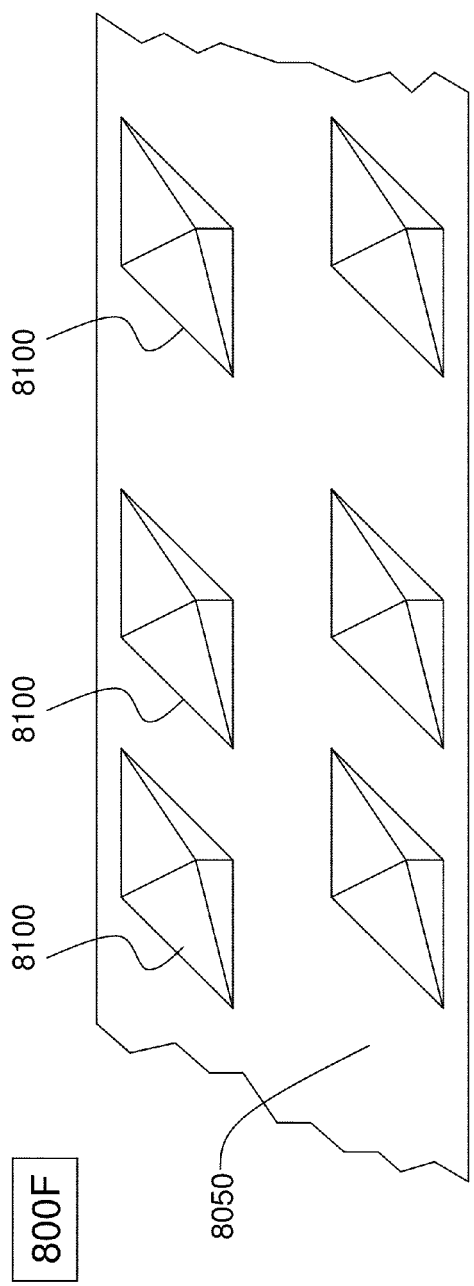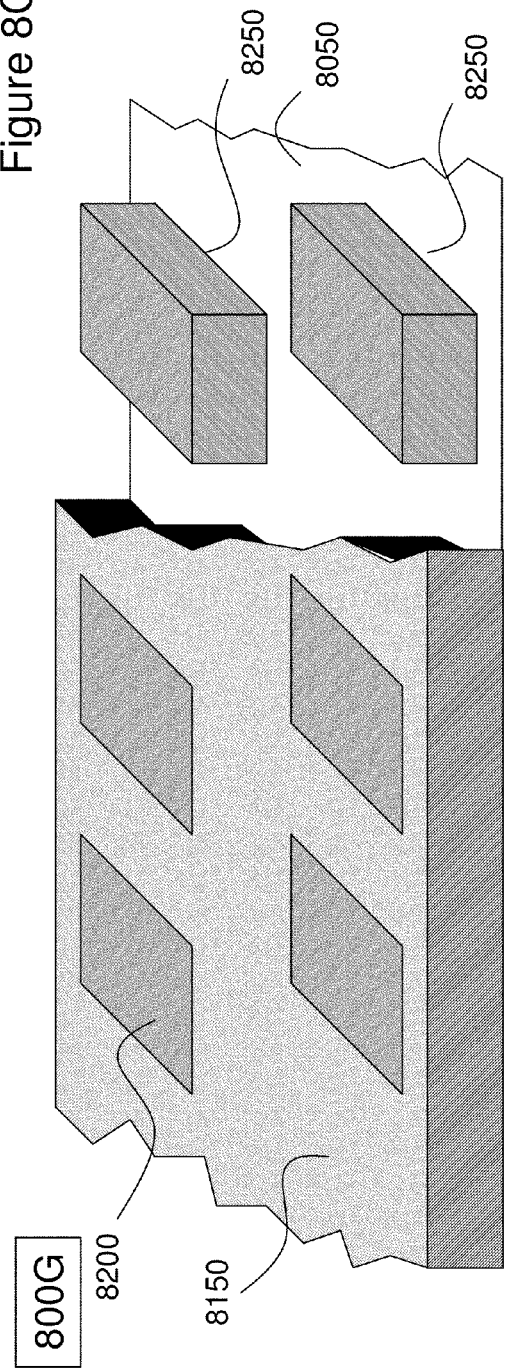

LATERAL GROWTH SEMICONDUCTOR METHOD AND DEVICES

CROSS-REFERENCE TO RELATED APPLICATIONS

This application claims the benefit of priority to U.S. Patent Application Ser. No. 61/254,332 filed Oct. 23, 2009 entitled "Lateral Growth Semiconductor Method and Devices" and U.S. Patent Application Ser. No. 61/319,435 entitled "Single Crystalline Semiconductors on Amorphous and Lattice-Mismatched Substrates" filed Mar. 31, 2010.

FIELD OF THE INVENTION

This invention relates semiconductor materials and more particularly semiconductor materials grown on amorphous and/or lattice mismatched substrates and the uses thereof.

BACKGROUND OF THE INVENTION

In the past 50 years since the demonstration of the first silicon transistor there has been a continuous evolution in semiconductor integrated circuits from the first Small-Scale Integration (SSI) with only a few transistors the semiconductor industry has grown to dominate many aspects of human society. Today compact wireless portable devices harbor microprocessors with more processing power than state of the art desktop computers 30 years ago and provide seamless integration of multiple applications such as office applications, gaming, electronic communications (wireless, text, email), and Internet browsers as well as supporting operation to multiple wireless standards. Hewlett-Packard's first laptop computer in 1984 the HP-110 and IBM's famous XT desktop computer in 1981 exploited Intel 8088 processors operating at 10 MHz with 256 kB of RAM and 10 MB hard-disk drive (HDD) and were considered too expensive for consumers and business machines. Today teenagers replace their Apple iPhone every couple of years as an easily disposed off high volume consumer item with 1 GHz process (100 times higher clock), 512 Mb RAM (2000 times higher) and 32 GB high speed flash HDD (3000 times higher, smaller, faster, less power).

Silicon digital circuits have evolved through successive generations of SSI, MSI, LSI, VLSI, ULSI, WSI (wafer scale integration), SOC (system-on-a-chip) and 3D-IC to provide tens of billions of transistors. This rapid development of the semiconductor industry has had a profound impact in our society where kindergarten children play with toys with more processing power than NASA's Apollo lunar landers, where children learn, communicate, and are entertained increasingly with compact portable electronics, and adults in nearly every aspect of their life cannot work, cook, travel, entertain without a microprocessor being involved somewhere.

In 2009 the global sales for semiconductor devices for entertainment, communications, transportation, medical systems was approximately US$226 billion, with US based businesses accounting for US$112 billion of that. But the industry features a number of distinct characteristics that position it uniquely in the economy and in the global competitive arena. These include:

The semiconductor industry is widely recognized as a key driver for economic growth in its role as a multiple lever and technology enabler for the whole electronics value chain. In other words, whilst the worldwide base semiconductor market was approximately US$200 billion in 2004, the industry enabled the generation of some US$1,200 billion in electronic systems business and US$5,000 billion in services, representing close to 10% of worldwide GDP;

The need for high degrees of flexibility and innovation in order to constantly adjust to the rapid pace of change in the market. Many products embedding semiconductor devices often have a very short life cycle. At the same time, the rate of constant price-performance improvement in the semiconductor industry is staggering. As a consequence, changes in the semiconductor market not only occur extremely rapidly but also anticipate changes in industries evolving at a slower pace. Yet another consequence of this rapid pace is that established market strongholds can be displaced all too quickly.

Within this semiconductor industry silicon dominates but many aspects of our electronic systems, devices, and infrastructure would not exist without the low cost availability of high performance devices and circuits exploiting binary semiconductors such as silicon germanium (SiGe, for high frequency RF circuits) and gallium arsenide (GaAs, for high frequency RF circuits) or the myriad of compound semiconductors from the quaternary semiconductor indium gallium arsenide phosphide (InGaAsP, for high speed electronics, optoelectronic devices for multi-gigabit optical communications, LEDs etc). In addition to enabling the infrastructure of telecommunication networks today from 100 Gb/s backbone networks to Fibre-to-the-Home (FTTH) in the optical domain and 3G, 4G, WiFi, WiMAX in the wireless domain such semiconductors and a range of other materials provide the key to addressing a wide range of issues ranging from sustaining the drive for increased integration and functionality through to the fundamental sustaining of our expectations of heat and light.

Solar Cells: Developing an abundant renewable energy source is required to mitigate climate change, maintain our standard of living in the developed countries and improving the standard of living in the large parts of the world we label as developing. Currently, geographically-limited, clean energy sources, such as wind, geothermal and hydro power, are cost-competitive with grid energy generated from fossil or nuclear fuels. Solar-derived, clean energy, on the other hand, is universally available but is not yet cost-competitive. Because of its availability and abundance, solar energy has great potential to reduce climate change; but, its high cost/Watt is the major hurdle to its adoption. First generation photovoltaics (PVs) produced energy at a cost of about $0.30/kWh with efficiencies around 14% and were constructed on single-crystalline, Si substrates. Second generation, thin-film-based PVs grown on amorphous substrates are less efficient, around 8%; however, because of their reduced costs, typically they produce energy at a lower cost/Watt, about $0.10/kWh. Second generation PVs are less efficient because of their poly-crystalline or amorphous microstructures which increase recombination rates and decrease efficiency.

Third generation solar cells are expected to have high efficiencies, associated with high-quality semiconductors of multiple materials to cover increased spectral range, at reduced costs, associated with amorphous substrates, and will better compete with grid electricity, ~$0.04/kWh. Third generation PVs will require therefore the production of high-quality semiconductors on inexpensive, large substrates. These third generation multi-junction PVs maximize energy production by converting high-energy photons to excitons using large-bandgap semiconductors and longer-wavelength photons to excitons with smaller-bandgap materials and are typically based on the Ge/GaAs lattice constant, partially because a large range of bandgaps are available at or near this lattice constant, see for example J. F. Geisz et al in "40.8% Efficient Inverted Triple-Junction Solar Cell with Two Independently Metamorphic Junctions" (Applied Phys. Lett., Vol. 93, No. 12, 123505, 3 pages). However, both Ge and GaAs substrates are small and expensive making these highly-efficient PVs (>40%) expensive and unable to enjoy economies-of-scale. In addition, this lattice constant does not have all the needed bandgaps to make the most efficient PVs, around 0.7, 1.2, and 1.8 eV, see for example A. Marti et al in "Limiting Efficiencies for Photovoltaic Energy Conversion in Multigap Systems" (Solar Energy Materials and Solar Cells, Vol. 43, No. 2, pp 203-222, 1996).

To achieve cost parity with the electrical grid, both decreased PV price and increased efficiency are needed. To date, most technologies have focused on either the efficiency (e.g. multi-junction PVs, see Geisz and Marti supra for example) or the cost (e.g. PVs based on amorphous substrates, see K. Yamamoto et al in "Novel Hybrid Thin Film Solar Cell and Module" (Proc. $3^{rd}$ World Conference Photovoltaic Energy Conversion, pp 2789-2792, 2003)) to impact the $/Watt figure of merit. However, there are few technologies that can address both the numerator and the denominator because, heretofore, high-efficiency and low-cost have been largely orthogonal goals. This arises as high efficiency PVs require high-quality, small and expensive semiconductor substrates; while low cost PVs, required large amorphous substrates, upon which high-quality materials were unavailable. Attempts to address this with direct growth of planar semiconductors on amorphous substrates typically fail as they lead to amorphous or poly-crystalline materials because of the coalescence of crystals from many uncontrolled, randomly-oriented nucleation events during the growth (see for example C. V. Thompson et al in "Texture Development in Polycrystalline Films" (Mat. Sci. and Eng. B, Vol. 32, No. 3, pp 211-219)). Amorphous and poly-crystalline microstructures increase minority carrier recombination thereby reducing PV efficiency. It would be beneficial for such broad spectrum high efficiency and low cost solar cells to therefore provide a method of controlling the growth location and nucleation of crystals to ensure pre-defined areas of single-crystalline semiconductor material are formed on large amorphous substrates.

Solid State Lighting: The establishment 100 years ago of tungsten filament lamps fundamentally shifted how people live, work, play. However, the efficiency of such light sources is woefully low. For example a 60 W incandescent light is only 2.1% efficient, a quartz halogen only 3.5%, in terms of generating light within the visible spectrum of the human eye. Accordingly today there is a massive worldwide campaign to have incandescent lights replaced wherever possible by compact fluorescent lights (CFL) which have an efficiency of approximately 22% thereby reducing energy consumption significantly. However, whilst CFLs provide an immediate and visible statement by Governments and other organizations worldwide that they are addressing global climate change, environmental issues etc they are not a panacea and have many disadvantages including health, safety, and environmental issues from their mercury content, UV emissions degrading some materials, flicker affecting individuals with conditions including autism, epilepsy, lupus, chronic fatigue syndrome, and vertigo, radio interference, operating temperature where efficiency drops with increasing/decreasing temperature from room temperature, non-operation at below freezing, low-luminance requiring long tubes and limiting power output, dimming, and recycling through the phosphor and mercury.

In contrast a monochromatic solid state light source within the visible wavelength range can achieve in principle an efficiency approaching 100%. Additionally such solid state light sources should also reduce consumption of precious metals, reduce recycling as well as address health and safety issues. Beneficially solid state light sources by virtue of their small size, low weight, and low voltage operation can also be employed in a wide range of situations where incandescent or CFL lights cannot. But today solid state lighting sales accounts for only approximately 2% of the global lighting market as the majority of the lighting market remains inaccessible despite the considerable research effort and investment that have been expended in the past decade.

This arises due to the challenges in realizing suitable LED technologies and devices using conventional quantum well structures, these including the relatively low internal quantum efficiency of these structures, the low light extraction efficiency realized, and relatively high device fabrication costs. Additionally to achieve a "white" LED today these devices generally employ a phosphor-conversion scheme, which sets the ultimate quantum efficiency of white LEDs to below 65%. In this regard, the high luminescence efficiencies, low fabrication costs, and processibility of semiconductor nanostructures, including quantum dots and nanowires, have made them promising candidates for future lighting devices and the subject of considerable research and development.

Whilst the ternary AlGaAs and quaternary InGaAsP/InGaAlP material systems have been subject to substantial development for infra-red/red light sources for optical communications and displays developments for LEDs within the remainder of the visible spectrum have been scattered across multiple materials including nitrides of group III elements including aluminum, gallium and boron. In contrast InN exhibits the highest electron mobility (4400 $cm^2V^{-1}s^{-1}$ at 300 K), the smallest effective mass, and the highest saturation velocity of the group III nitrides making it an excellent candidate for next generation of nanophotonic and nanoelectronic devices, including chip level nano scale lasers and high-speed field effect transistors. Additionally, the band gap of InN at approximately 0.7 eV (1750 nm) when compared with GaN at approximately 3.3 eV (370 nm) means that the ternary alloy InGaN can be continuously tuned from ~0.7 to 3.3 eV, matching almost perfectly the solar spectrum and visible spectrum of the human eye. Therefore, InGaN has also emerged as a promising material for future both high-efficiency full solar spectrum solar cells and high-efficiency white light sources.

It should be apparent to one skilled in the art that in order to provide such broad spectrum optical emitters/absorbers that they should be structured so that the material at the front of the solar cell absorbs the shortest wavelengths and progressively longer wavelengths are absorbed by layers within the solar cell towards the substrate. As such, the material should grade from $In_xGa_{1-x}N$ where x≈1 to $In_yGa_{1-y}N$ where y≈0. As such it is necessary to grow InN structures onto the substrate of the solar cell which may be plastic, ceramic, or amorphous silicon for example. As such it would be beneficial for such low cost high efficiency solid state light sources to provide a method of controlling the growth location and nucleation of crystals to ensure pre-defined areas of single-crystalline semiconductor material are formed on large amorphous substrates.

MEMS and Sensors: Microelectromechanical systems (MEMS) are small integrated devices or systems that combine electrical and mechanical components. The components can range in size from the sub-micrometer level to the millimeter level, and there can be any number, from one, to few, to potentially thousands or millions, in a particular system. Historically MEMS devices have leveraged and extended the fabrication techniques developed for the silicon integrated circuit industry, namely lithography, doping, deposition, etching, etc. to add mechanical elements such as beams, gears, diaphragms, and springs to silicon circuits either as discrete devices or in combination with integrated silicon electronics. Whilst the majority of development work has focused on silicon electronics additional benefits may be derived from integrating MEMS devices onto other existing electronics platforms such as silicon germanium (SiGe), gallium arsenide and, indium phosphide for RF circuits and future potential electronics platforms such as organic based electronics, nanocrystals, etc whilst supporting the drive towards compact hybridly integrated or SOC implementations.

Whilst today MEMS device applications include inkjet-printer cartridges, accelerometers, miniature robots, micro-engines, locks, inertial sensors, micro-drives, micro-mirrors, micro actuators, optical scanners, fluid pumps, transducers, chemical sensors, pressure sensors, and flow sensors. New applications are emerging as the existing technology is applied to the miniaturization and integration of conventional devices. These systems can sense, control, and activate mechanical processes on the micro scale, and function individually or in arrays to generate effects on the macro scale. The micro fabrication technology enables fabrication of large arrays of devices, which individually perform simple tasks, or in combination can accomplish complicated functions. Such systems incorporating MEMS will also increasing include the integration of chemical and biological sensors as well as pushing the envelope of performance of electronics and micro-mechanical design. For example, a GaAs RF oscillator may provide an enhanced clock through down conversion for a high speed silicon IC than multiplying up a low frequency silicon oscillator or requiring an external crystal oscillator.

In some MEMS structures it would be beneficial to provide amorphous materials, such as silicon carbide (SiC) for example into MEMS devices and systems. SiC offers improved mechanical properties such as higher acoustic velocity, high fracture strength and desirable tribological properties as well as having an ability to sustain higher temperatures and resist corrosive and erosive materials. Hence, it would be beneficial for some applications to form silicon MEMS devices upon an amorphous SiC substrate removing temperature or chemical constraints from packaging all-silicon MEMS devices. Equally forming localized GaAs, InP, or other semiconductor materials within predetermined regions of amorphous silicon substrates may provide enhanced MEMS and/or system functionality including for example electronic or optoelectronic elements.

Integration of Lattice Mismatched Materials: As evident from considerations of solid state lighting, MEMS, PVs there is significant benefit from integrating either materials with mismatched lattices, e.g. GaAs and Si, or forming crystalline materials on amorphous materials, e.g. InN on α-Si. However, currently the integration of lattice mismatched materials is a significant challenge. Approaches adopted to date have included bonding, such as epitaxial lift-off through sacrificial layers within the semiconductor structure, see for example P. Demeester et al in "Epitaxial lift-off and its applications" (Semi. Sci. & Tech., Vol. 8, No. 6, pp 1124-), R. Moug et al in "Development of an Epitaxial Lift-Off Technology for II-VI Nanostructures using ZnMgSe Alloys" (Microelect. J., Vol. 30, No. 3, pp 530-532) and even semiconductors to ferroelectrics, see for example A. C. O'Donnell et al in "Integration of GaAs MESFETs and Lithium Niobate Optical Switches using Epitaxial Lift-Off" (Elect. Lett., Vol. 26, No. 15, pp 1179-181), and wafer bonding, see for example M. Alexe et al in "Wafer Bonding—Applications and Technology" (Springer-Verlag ISBN 3-540-21049-0) and S. S. Iyer et al in "Silicon Wafer Bonding Technology for VLSI and MEMS Applications" (Published by INSPEC ISBN 0 85296 039 5).

These approaches being employed to address the disadvantages of direct growth with mismatched lattice semiconductors, see for example P. Demeester et al in "Relaxed lattice-mismatched growth of III-V semiconductors" (Prog. Crystal Growth and Characterization of Materials, Vol. 22, Nos. 1-2, pp 53-141) and D. Gerthsen et al in "Structural Properties of Lattice-Mismatched Compound Semiconductor Heterostructures" (Adv. Solid State Phys, Volume 34/1994, pp 275-295). Alternatively within direct growth adding additional layers to act as buffer layers has been exploited, but as with direct growth the acceptable mismatches that can be accommodated are low unless extremely thick buffer layers are employed which in many instances destroy the function of the electrical or optical device, see for example P. M. Mooney et al in "Si Ge Technology: Heteroepitaxy and High-Speed Microelectronics" (Ann. Rev. Mat. Sci. Vol. 30, pp 335-362) and J. E. Ayers in "Heteroepitaxy of Semiconductors: Theory, Growth and Characterization" (CRC Press 2007).

Typically direct growth is preferred because graded buffers can require microns of growth to get low defect densities and bonding is both, expensive and difficult. In the direct growth method (and graded buffer method, for that matter) a lattice-mismatched film is grown onto the surface of a substrate which provides the crystalline template for the film. However, direct growth also yields the poorest quality material, wherein threading dislocation densities generally increases with lattice mismatch and can exceed $10^8/cm^2$ for the large lattice-mismatches within devices such as multi-junction PVs. In addition to threading dislocations the as grown films exhibit increased stress and cracking.

Accordingly it would be beneficial to provide a means of growing high quality crystalline films of semiconductors on substrates or other epitaxially grown layers wherein the underlying layer/substrate either exhibits a high lattice mismatch between the two crystalline materials or the crystalline semiconductor and an amorphous material. As such there is disclosed a novel, metal-catalyzed growth process that occurs laterally rather than vertically as commonly occurs in most epitaxial processes based upon techniques such as LPE, MOVPE, MBE, MOCVD etc. With this technique the location of crystal nucleation is controlled from the catalyst location as well as the formation of grain boundaries, typical when crystals grow together, is prevented. Such engineered crystal nucleation and lateral growth provides for an enablement of devices such as PVs, solid state lighting, high speed electronics and optoelectronics by allowing large amorphous substrates to be tiled with single-crystalline semiconductors within which these devices are subsequently formed through photolithography, etching, doping, metallization etc. Further by providing increased flexibility in the layers within such devices essentially another degree of design freedom is given to circuit designs to produce high efficiency, low cost structures through enabling the growth of high-quality, lattice-mismatched semiconductors.

SUMMARY OF THE INVENTION

It is an object of the present invention to obviate or mitigate at least one disadvantage of the prior art.

In accordance with an embodiment of the invention there is provided a method comprising using catalyzed growth to grow a film on a substrate, the film having a width predominantly larger than its thickness and whose growth is at least partially lateral.

In accordance with an embodiment of the invention there is provided a device comprising a film grown on a substrate, the film having a width larger than its thickness and grown through a catalyzed growth process.

In accordance with an embodiment of the invention there is provided a method comprising the steps of providing a substrate of a first material, the first material having an amorphous structure or a crystalline structure defined by a first lattice constant, providing a nucleation site at a predetermined location, establishing a predetermined environment for the substrate, and growing from the nucleation site a second material having a crystalline structure defined by a second lattice constant.

In accordance with an embodiment of the invention there is provided a method comprising the steps of:
(a) providing a substrate of a first material, the first material having an amorphous structure or a crystalline structure defined by a first lattice constant;
(b) providing a seed layer deposited on top of the substrate;
(c) providing an opening within the seed layer exposing a predetermined region of the substrate;
(d) providing a nucleation site at a predetermined point upon the seed layer within the opening;
(e) establishing a predetermined environment for the substrate; and
(f) growing from the nucleation site a second material having a crystalline structure defined by a second lattice constant.

In accordance with an embodiment of the invention there is provided a device comprising a substrate and a second material grown on the substrate. The second material having been grown with a process comprising the steps of providing the substrate of a first material, the first material having an amorphous structure or a crystalline structure defined by a first lattice constant, providing a nucleation site at a predetermined location, establishing a predetermined environment for the substrate, and growing from the nucleation site the second material, the second material having a crystalline structure defined by a second lattice constant.

In accordance with an embodiment of the invention there is provided a device comprising a substrate and a second material grown on the substrate. The second material having been grown with a process comprising the steps of:
(a) providing the substrate of a first material, the first material having an amorphous structure or a crystalline structure defined by a first lattice constant;
(b) providing a seed layer deposited on top of the substrate;
(c) providing an opening within the seed layer exposing a predetermined region of the substrate;
(d) providing a nucleation site at a predetermined point upon the seed layer within the opening;
(e) establishing a predetermined environment for the substrate; and
(f) growing from the nucleation site the second material having a crystalline structure defined by a second lattice constant.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIGS. 8A through 8C present schematics of growth exploiting catalyzed crystalline growth on a mismatched substrate according to embodiments of the invention;

DETAILED DESCRIPTION

The present invention is directed to semiconductor materials and more particularly semiconductor materials grown on amorphous and/or lattice mismatched substrates and the uses thereof.

Reference may be made below to specific elements, numbered in accordance with the attached figures. The discussion below should be taken to be exemplary in nature, and not as limiting of the scope of the present invention. The scope of the present invention is defined in the claims, and should not be considered as limited by the implementation details described below, which as one skilled in the art will appreciate, can be modified by replacing elements with equivalent functional elements.

The invention relates to using lateral, metal-catalyzed growth such that high-quality crystalline semiconductors can be grown on amorphous substrates. Typically, metal-catalyzed growth on substrates causes crystals (whiskers) to grow in <111>-type directions. If the connection between the crystal and the substrate is epitaxial, the crystal grows in a <111> direction, templated by the substrate. On the other hand, if the substrate is amorphous, the crystal will usually grow in a random direction away from the substrate, see for example Z. Fan et al in "Wafer-Scale Assembly of Highly Ordered Semiconductor Nanowire Arrays by Contact Printing" (Nano Lett., 2008, Vol. 8, No. 1, pp 20-25). If the substrate is crystalline and lattice mismatched the growth will result in high stress and even cracking in the grown films, see for example K. Pinardi et al in "Critical Thickness and Strain Relaxation in Lattice Mismatched Semiconductor Layers" (J. Appl. Phys., Vol. 83, Is. 9, pp 4724-4733). As such as outlined supra it would be desirable for lowering the cost of optoelectronic and electronic devices as well as enabling new applications for semiconductor devices to be fabricated either upon amorphous substrates, crystalline substrates with mismatched lattice, or other semiconductor layers. The inventors have established by engineering structures in conjunction with metal-catalyzed such crystalline growths including for example <110> type Si crystal growth against an amorphous $SiO_2$ substrate as well as the lateral growth of Ge on both amorphous and Si substrates which could be used to grow high-quality, single-crystalline materials on amorphous or lattice-mismatched substrates.

Figure 1:
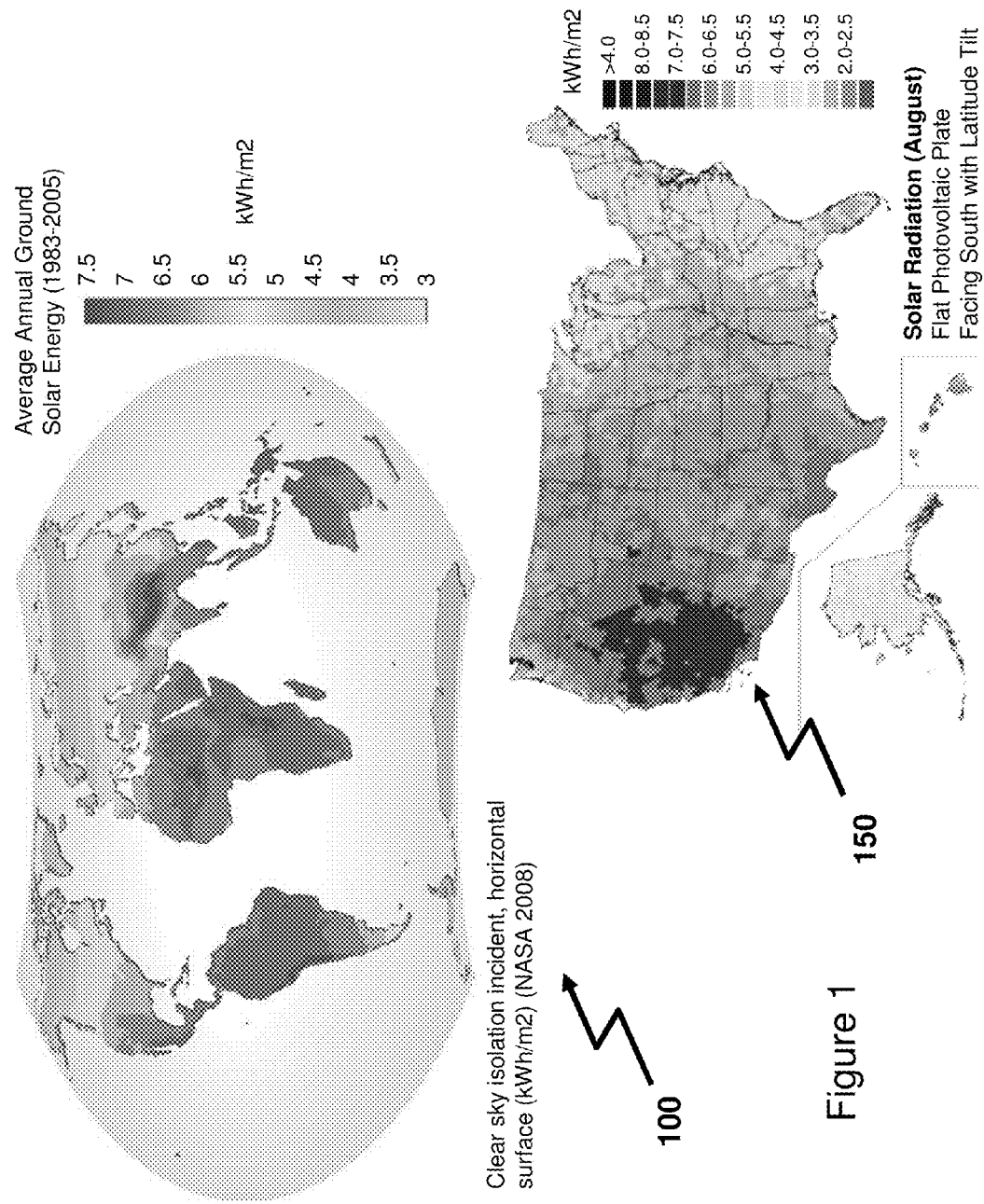
FIG. 1 presents plots of annual ground solar energy globally and for the United States.

Referring to FIG. 1 there is shown global map 100 that depicts the average annual ground solar energy over the period 1983-2005 (from http://www.parario.com/resources/economy/articles/1/article.html) that shows for most of South America, Africa, India, South East Asia, and Australasia that solar energy is between approximately 6.5 kWh/$m^2$/day→7.5 kWh/$m^2$/day. Within North America, Europe, Russia and northern China the solar energy drops to approximately 4.5 kWh/$m^2$/day→6 kWh/$m^2$/day. Total solar energy received by the Earth at ground level is approximately 85,000 TW, which compares to an annual global energy consumption of 15 TW, and yet renewable energy sources only account for approximately 1% of global energy production. Within the United States solar photovoltaic (PV) energy production accounted for approximately 0.1% of energy production despite as evident from continental US map 150 that solar radiation across a significant portion of the continental United States receives 6.5 kWh/$m^2$/day→7.5 kWh/$m^2$/day. This being particularly so in the south western states of California, Arizona, New Mexico, Texas, Colorado, Nevada, and Utah representing approximately 25% of the US population, where incentives for renewable energy and protecting the environment are strong, and where conditions annually do not vary significantly unlike the north eastern states. So what is preventing the wider penetration of PV energy sources when Government incentives such as San Francisco's Public Utilities Commission GoSolarSF program in conjunction with the State of California pays at least 50% of the cost of a solar power system.

So what is preventing the uptake of PV as a renewable source of energy, quite simply cost. Industry estimates for four different PV solar cell technologies crystalline silicon (c-Si), amorphous silicon (α-Si), copper indium gallium diselenide ($CuInGaSe_2$, commonly referred to as CIGS) and cadmium telluride (CdTe) respectively trend over the period 2006-2020 from an initial 24-30 cents per kWh (0.24\$/kWh to 0.30\$/kWh) to between 8-10 cents per kWh (0.08\$/kWh to 0.10\$/kWh). However, in 2006 average electricity cost in the continental US was 8.6 cents per kWh (0.086\$/kWh) and hence where PV becomes cheaper than conventional fossil fuel electricity generation currently depends upon the PV industry achieving its projected cost reductions and the rate of inflation. For inflation at 7% per annum this intersect may occur in 2013 but at 4% per annum it moves out to 2016, and for the past 2 years inflation has averaged approximately 1% which pushes the intersection even further out. Hence, at present despite the significant effort and capital expenditure being invested into PV cell technologies and solar cell manufacturing technologies there is little financial incentive for producers/users to embrace PV.

Figure 2:
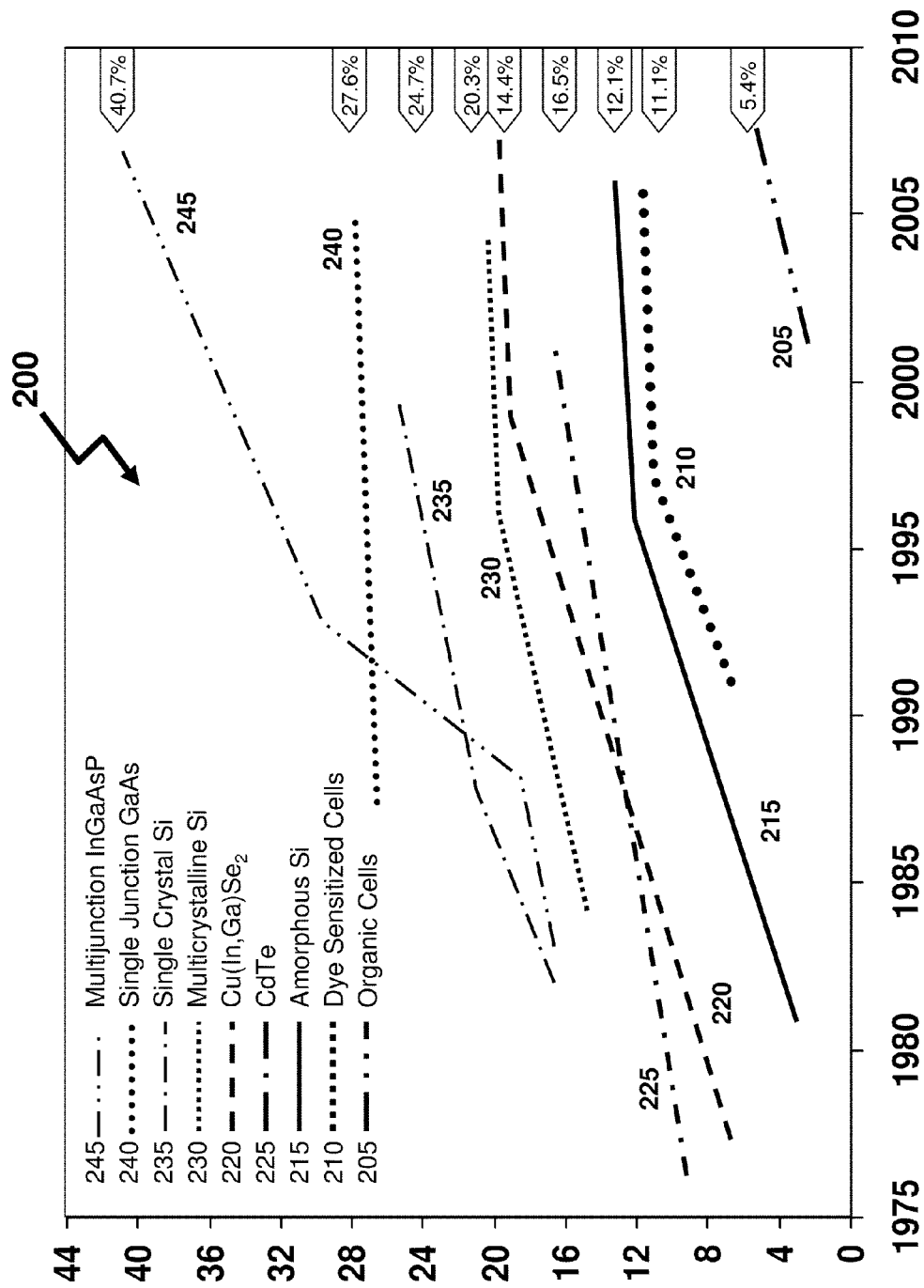
FIG. 2 is plot of efficiency as function of time for first, second and third generation solar cell materials technologies.

Now referring to FIG. 2 there is shown a plot 200 of efficiency as function of time for first, second and third generation solar cell materials technologies as amongst the aspects of PV cells determining the cost of generated electricity is their efficiency. Plot 200 shows PV cell efficiency versus time from 1975 to today for different technologies. Considering first the four technologies considered above for cost projections then there is shown α-Si 215 where best reported efficiencies have remained quite stable at around 12%, CdTe 225 where reported efficiencies are approximately 16.5%, CIGS 220 which has peaked at approximately 20% and c-Si 235 where efficiencies are approximately 25%. Due to its similarity with other silicon PV technologies and the massive existing silicon manufacturing infrastructure multicrystalline Si 230 has also been subject of significant research demonstrating comparable efficiencies around 20% as CIGS. Significant research and development has gone into other semiconductor materials such as gallium arsenide 240 (GaAs) at approximately 28% and multi-junction indium gallium arsenide phosphide 245 (InGaAsP) where developments continue to present improvements having reached approximately 40% efficiency as of the end of 2009. GaAs 240 and InGaAsP 245 seek to exploit the broader wavelength range of solar radiation than is accessible with silicon and potentially offer a path to significantly higher efficiencies by the introduction of quantum well, quantum dot and crystal technologies as described below in respect of FIG. 6. However, their increased efficiency comes at a cost as their manufacturing processes are more expensive and the largest commercial wafers currently are 100 mm (4 inch) whereas silicon commercial wafers are typically 200 mm (8 inch) and 300 mm (12 inch) today.

Also shown are organic cells 205 and dye sensitized cells 210, the later employing a porous film of nanocrystalline titanium dioxide (TiO2) particles deposited onto a conducting glass electrode with organic dyes to provide visible sensitivity for conduction effects in the TiO2 which otherwise is limited to ultraviolet wavelengths. Each of these technologies promising the ability to fabricate low cost large area PV cells but at present despite significant research, for example over 800 patents on dye sensitized cells 210 alone, their efficiencies at approximately 5% and 10% respectively still require large solar panels to generate any significant power.

Figure 3:
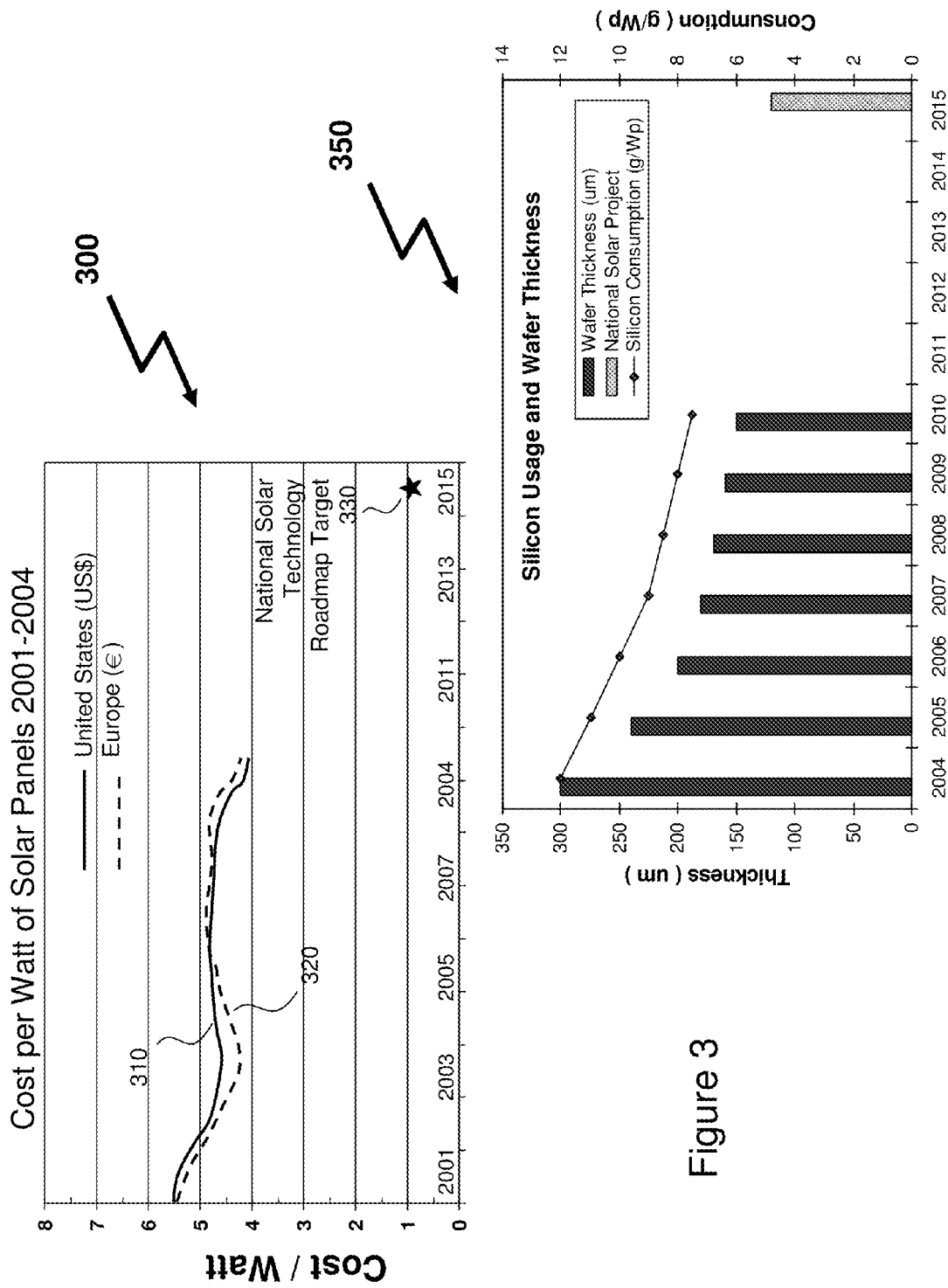
FIG. 3 presents the historical cost per watt of solar power and usage of silicon as a function of time together with the US National Solar Technology Roadmap targets for 2015.

Hence, at present the erosion in electricity cost outlined above is projected by analysts to occur not from fundamental PV materials technology but from a combination of increased efficiencies in manufacturing arising from increased wafer dimensions, i.e. moving from 200 mm production to 300 mm production, and the reduced cost of raw materials. A dominant raw material cost being the silicon wafers upon which the PV cells are fabricated. Referring to wafer cost plot 350 in FIG. 3 the silicon consumption is plotted according to data from the US National Solar Technology Roadmap published by the US Department of Energy showing a reduction from 12 g/Wp (grammes per Watt peak) to 7.5 g/Wp over the period 2004-2010 and being achieved through the reduction in wafer thickness from 300 μm to 150 μm. The projected wafer thickness in 2015 being 120 μm. 2015 being the date at which as shown in solar panel cost graph 300 in FIG. 3 the US National Solar Technology Roadmap target solar panel cost is $1/W. As shown by US cost curve 310 current pricing has not substantially eroded over the period 2001-2009 dropping from ~$5.50/W to $4.25/W. European cost curve 320 showing a similar trend without substantial erosion despite during that period silicon wafer thickness had decreased from approximately 375 μm to 150 μm and represents a larger reduction in raw material costs than those projected going forward.

Hence, it is evident that at present despite the known environmental benefits the PV industry is currently unable to substantially reduce both initial deployment costs and running costs such with current inflation projections fossil fuels will represent the lower cost option for electricity. Hence, the interest in dye sensitized cells and organic cells which despite lower efficiency offer lower manufacturing costs and multi-junction InGaAsP PVs that offer increased efficiency against single crystal Si and α-Si PVs. Multi-junction PVs achieving this increased efficiency by providing multiple PV elements that each address a different portion of the solar spectrum and which are stacked within the semiconductor structure to form an integrated unit.

Figure 4:
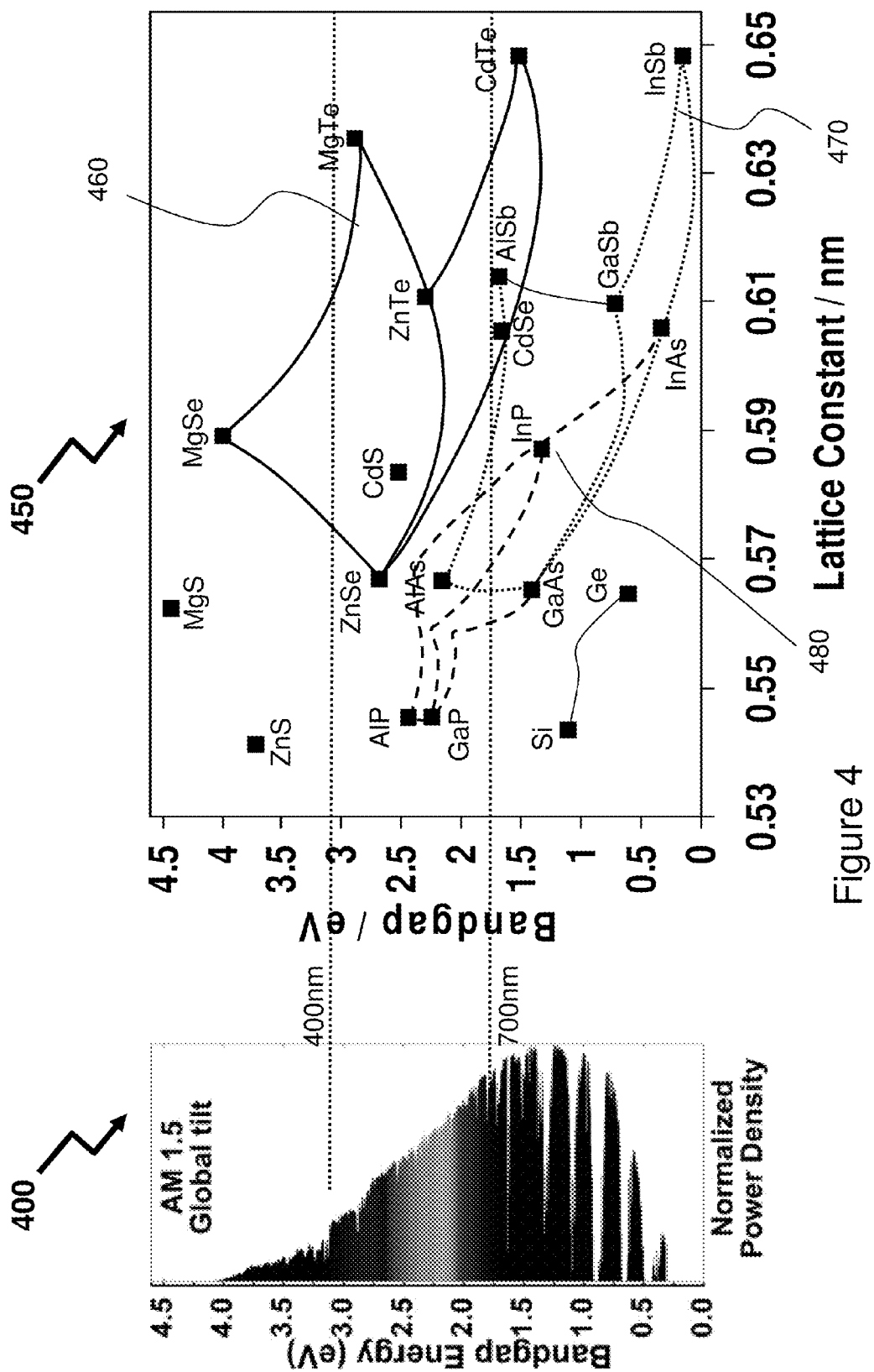
FIG. 4 plots the bandgap energy for different semiconductor technologies together with their lattice constant.

However, as is evident from FIG. 4 in plot 450 the bandgap energy for different semiconductor technologies varies within a narrow range and accordingly the multi-junction PV designs to operate over a substantial portion of the solar spectrum reaching the ground require multiple semiconductor materials be employed, a different one for each PV cell in the stack. As is evident from spectrum plot 450 the solar radiation extends from approximately 0.4 eV (approximately 3 μm in mid-infrared) to 4 eV (approximately 300 nm, in near ultra-violet). Accordingly if we consider Si then from plot 450 we see that it has a bandgap around 1.1 eV and has a lattice constant of approximately 0.54 nm, AlAs with bandgap around 2.2 eV has a lattice constant of approximately 0.566 nm, MgTe with bandgap around 3 eV has a lattice constant of approximately 0.635 nm, and ZnS at around 3.75 eV has a lattice constant of approximately 0.54 nm. Within the plot are shown first to third family curves 460, 470 and 480 respectively which denote the contours of bandgap and lattice constant for so-called "families" of semiconductors that have at their "corners" binary semiconductors such that tertiary semiconductors in the family are points along the boundary. First family curve 460 for example links binary MgSe (4 eV/0.59 nm) to MgTe (3 eV/0.63 nm) and ZnSe (2.7 eV/0.56 nm) and thence to CdTe (1.5 eV/0.65 nm) such that for example CdMgTe (cadmium mercury telluride) a common material for infrared detectors.

Second family curve 470 connects InSb (0.15 eV/0.648 nm) to InAs (0.3 ev/0.606 nm) and GaSb (0.75 eV/0.61 nm) and thence to GaAs (1.5 eV/0.564 nm), AlSb (1.7 eV/0.61 nm) and then AlAs (2.2 eV/0.565 nm). Third family curve 480 likewise begins at InAs (0.3 ev/0.606 nm) to then connect to GaAs (1.5 eV/0.564 nm) and InP (1.4 eV/0.588 nm) and thence to AlP (2.5 eV/0.542 nm) and GaP (2.25 eV/0.542 nm). Accordingly it would be evident that growing semiconductors in predefined sequence, absorbing the shorter wavelengths (higher energy) first and the longer wavelengths (lower energy) later and hence deeper into the semiconductor stack requires multiple materials which result in large lattice constant changes, e.g. AlP to AlSb to shift bandgap from 2.6 eV/0.544 nm to 1.7 eV/0.61 nm means the lattice constant shifts from 5.44 Å to 6.1 Å a 12% shift and at 0.66 Å must be considered against the atomic radius of aluminum of 1.4 Å. Accordingly significant stress can occur within these structures as the lattices accommodate the mismatch to adjacent layers.

Figure 5A:
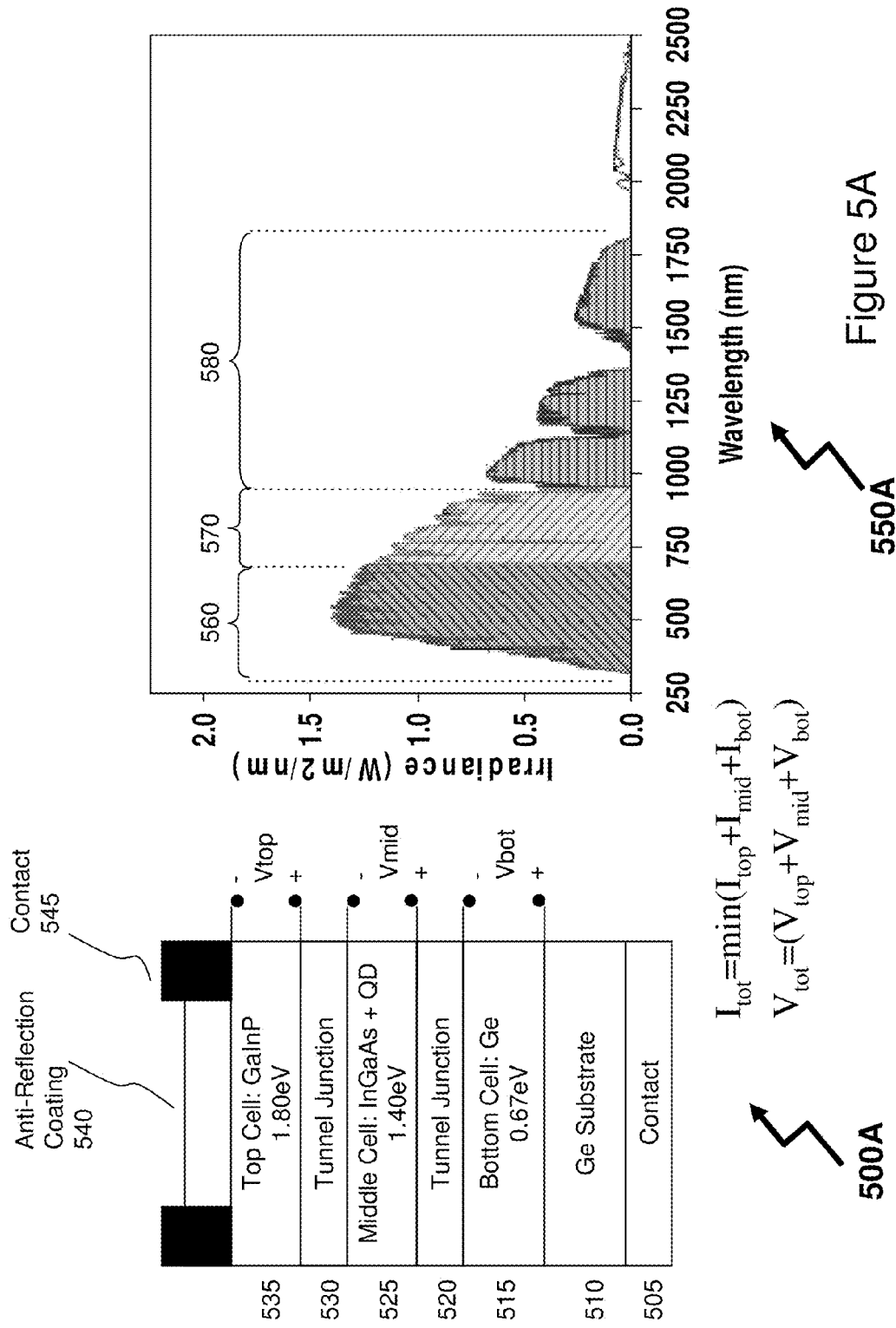
FIG. 5A presents a schematic of a multi-junction solar photovoltaic cell according to the prior art.

Now referring to FIG. 5A there is shown a schematic of a multi-junction solar photovoltaic cell according to the prior art of SpectroLab that achieved an efficiency of 40% (R. R. King et al "40% Efficient Metamorphic GaInP/GaInAs/Ge Multijunction Solar Cells" App. Phys. Lett. 90, No. 18). The semiconductor structure being shown in layer sequence 500A whilst the response of the PV cells is shown in spectrum 550A showing that three spectral regions 560-580 were implemented. Accordingly layer sequence 500A comprises three PV cells within the stack from the lower contact 505 and Ge substrate 510 to the anti-reflection coating 540 and front contacts 545. Bottom cell being Ge 515 with a bandgap of 0.67 eV, the middle cell of InGaAs 525 with quantum dots for a bandgap around 1.4 eV, and the upper cell being GaInP 535 with a bandgap of 1.8 eV. Disposed between each of Ge 515/InGaAs 525 and InGaAs 525 and GaInP 535 are first and second tunnel junctions 520 and 530 that act as thick graded buffers for lattice mismatch accommodation and allowing electron tunneling between the cells so that they are all electrically interconnected. As will be evident from the embodiments of the invention growth of the bottom cell of Ge 515 may be achieved on large area amorphous substrates rather than Czochralski grown single crystal Ge substrates which represent a significant portion of the cost of the PV cells, see for example T. Roesener et al in "MOVPE Growth of III-V Solar Cells on Silicon" (25th Euro. PV Solar Energy Conf., September 2010) where results on replacing Ge with Si substrates are presented.

Figure 5B:
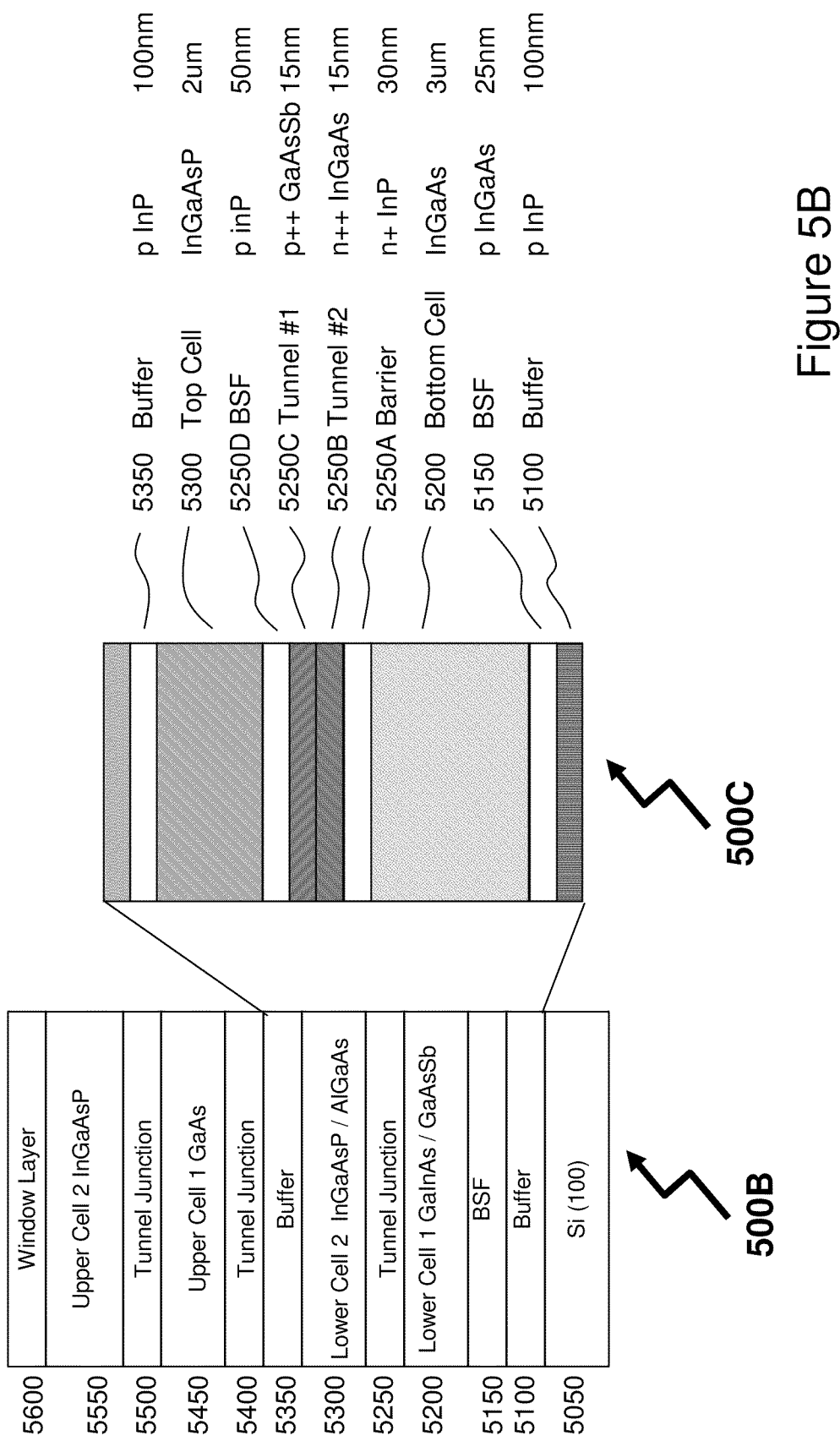
FIG. 5B presents a schematic of a multi-junction solar photovoltaic cell according to the prior art.

Referring to FIG. 5B there is presented a second multi-junction PV design according to the prior art a schematic of a multi-junction solar photovoltaic cell according to the prior art of the Helmholtz Zentrum Berlin (http://www.helmholtz-berlin.de/forschung/enma/materialforschung-pv/se4/arbeitsgebiete/solarzellenstrukturen/solarzellen_en.html). As shown the layer structure 500B comprises a silicon substrate 5050 upon which are buffer 5100, first back surface field structure (BSF) 5150 and lower cell 1 5200 formed from GaInAs/GaAsSb. Atop lower cell 1 5200 is first tunnel junction 5250 followed by lower cell 2 5300 formed from InGaAsP/AlGaAs and another buffer 5350. Subsequently there are grown second tunnel junction 5400, upper cell 1 5450 formed from GaAs, third tunnel junction 5500, upper cell 2 5550 formed from InGaAsP and window layer 5600.

Lower cell 1 5200 and lower cell 2 5300 for a low band gap tandem solar cell with optimized band gaps of 0.75 eV and 1.15 eV. This is expanded in sub-structure 500C wherein buffer 5100 and BSF 5150 are formed from 100 nm p-doped InP and 25 nm p InGaAs respectively atop which is bottom cell InGaAs of thickness 3 μm. Tunnel junction 5250 is formed from 30 nm barrier 5250A of n+ InP. 15 nm n++ InGaAs for tunnel #2 5250B, 15 nm p++ GaAsSb for tunnel #1 5250C, and 50 nm p InP BSF 5250D. Above this is top cell 5300 formed from 2 um of InGaAsP and buffer 5350 of 100 nm p InP. Again there is benefit in replacing the silicon wafers with large substrates with amorphous silicon or silicon dioxide as the layer below the solar PV stack.

Figure 6A:
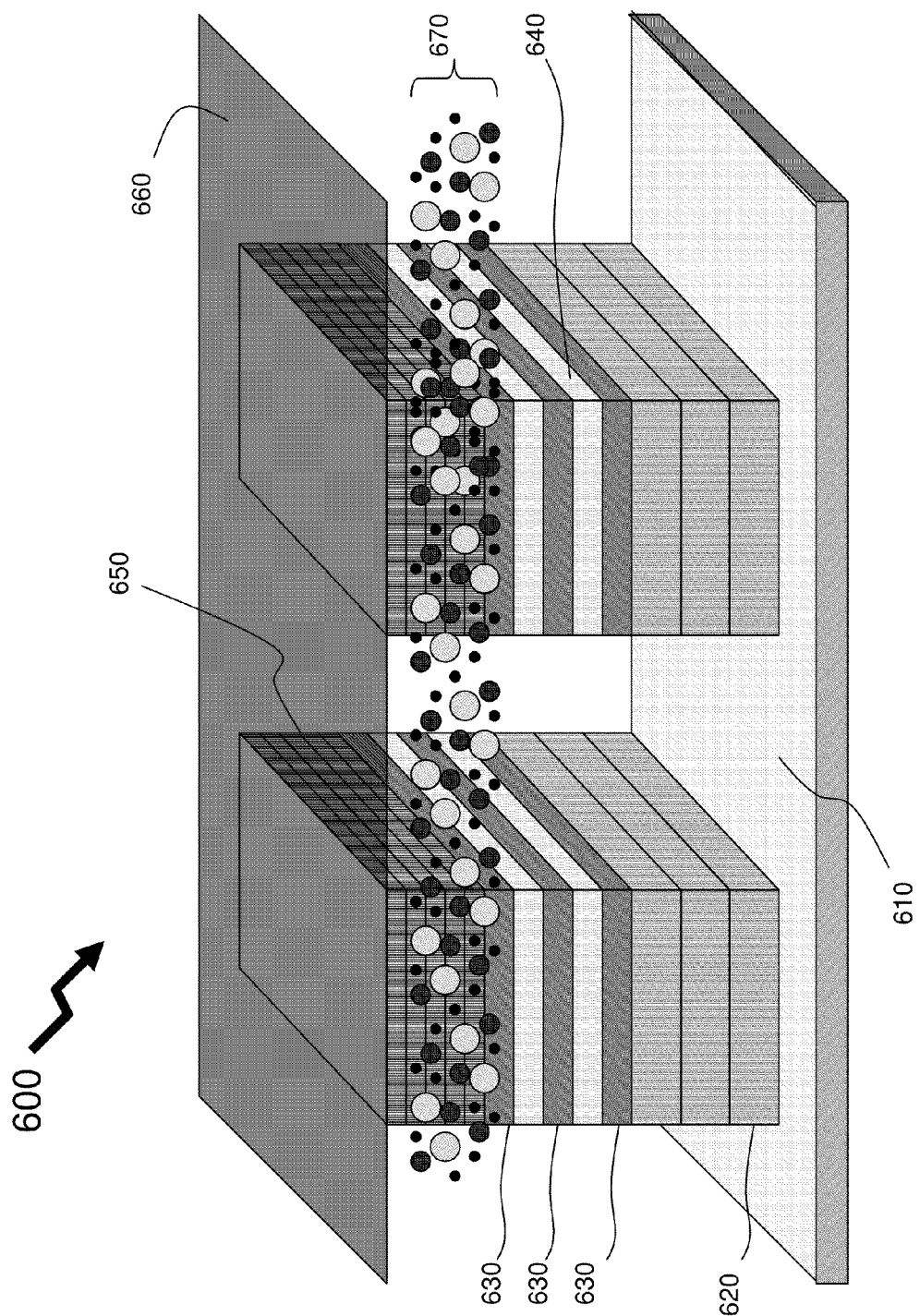
FIG. 6A presents a schematic of a proposed solid state light source exploiting quantum dots in conjunction with graded semiconductor diode structures.

Referring to FIG. 6A there is presented a schematic of a proposed solid state light source exploiting quantum dots in conjunction with graded semiconductor structures. White light source 600 comprising a substrate 610, for example n-type silicon, upon which are grown GaN layers doped with silicon to provide the lower n-type GaN material 620. The device active region consists of three InGaN quantum wells 630 separated by GaN spacers 640. Atop the three InGaN/GaN quantum wells magnesium (Mg) doped GaN is grown to form the p-type GaN 650.

Next colloidal quantum dots 670 have been spin-coated onto the surface after a planarization process to infill around the heterojunctions. The upper surfaces of the heterojunctions are then exposed using a selective etching process followed by the deposition of the ITO upper contact 960. As the colloidal quantum dots 670 largely reside above the InGaN/GaN quantum well regions their presence does not affect significantly the current flow, contact resistance or recombination process within the InGaN/GaN quantum well heterostructures. A portion of the emitted photons from the InGaN/GaN heterojunctions will be absorbed by the colloidal quantum dots 670 and "down converted" to photons with colours determined by the size and composition of the colloidal quantum dots 670.

For example the colloidal quantum dots may be CdS, CdSe, and CdTe to cover the blue/green/red portions of the visible spectrum. Some overlap of emission ranges occurs for example by size tuning the quantum dots, for example large CdS dots emit close to that of small CdSe dots. As taught by R. Cooney et al entitled "Gain Control in Semiconductor Quantum Dots via State-Resolved Optical Pumping" (Phys. Rev. Lett., Vol. 102, No. 12, 2009) at quantum dot diameters below 2.5 nm no optical gain had been demonstrated within the prior art thereby removing some of the expected value of confinement based tunability. However, R. Cooney et al demonstrated that optical gain in any quantum dot can be achieved if the quantum dots are pumped using state resolved optical pumping. Such state resolved optical pumping implying that potentially multiple InGaN/GaN quantum wire hetero structures may be required and/or the distribution of the colloidal quantum dots be controlled to ensure that dots requiring state resolved optical pumping have sources, be it the InGaN/GaN quantum well hetero structures or other colloidal quantum dots. As would be evident to one of skill in the art providing high yields with multiple InGaN/GaN quantum well heterostructures of relaxed stress design would generally be considered to be incompatible with large area low cost manufacturing upon amorphous substrates. However, as will be evident embodiments of the invention allow for the required high quality single crystalline silicon base layer to be formed upon either lower grade substrates or amorphous substrates.

Figure 6B:
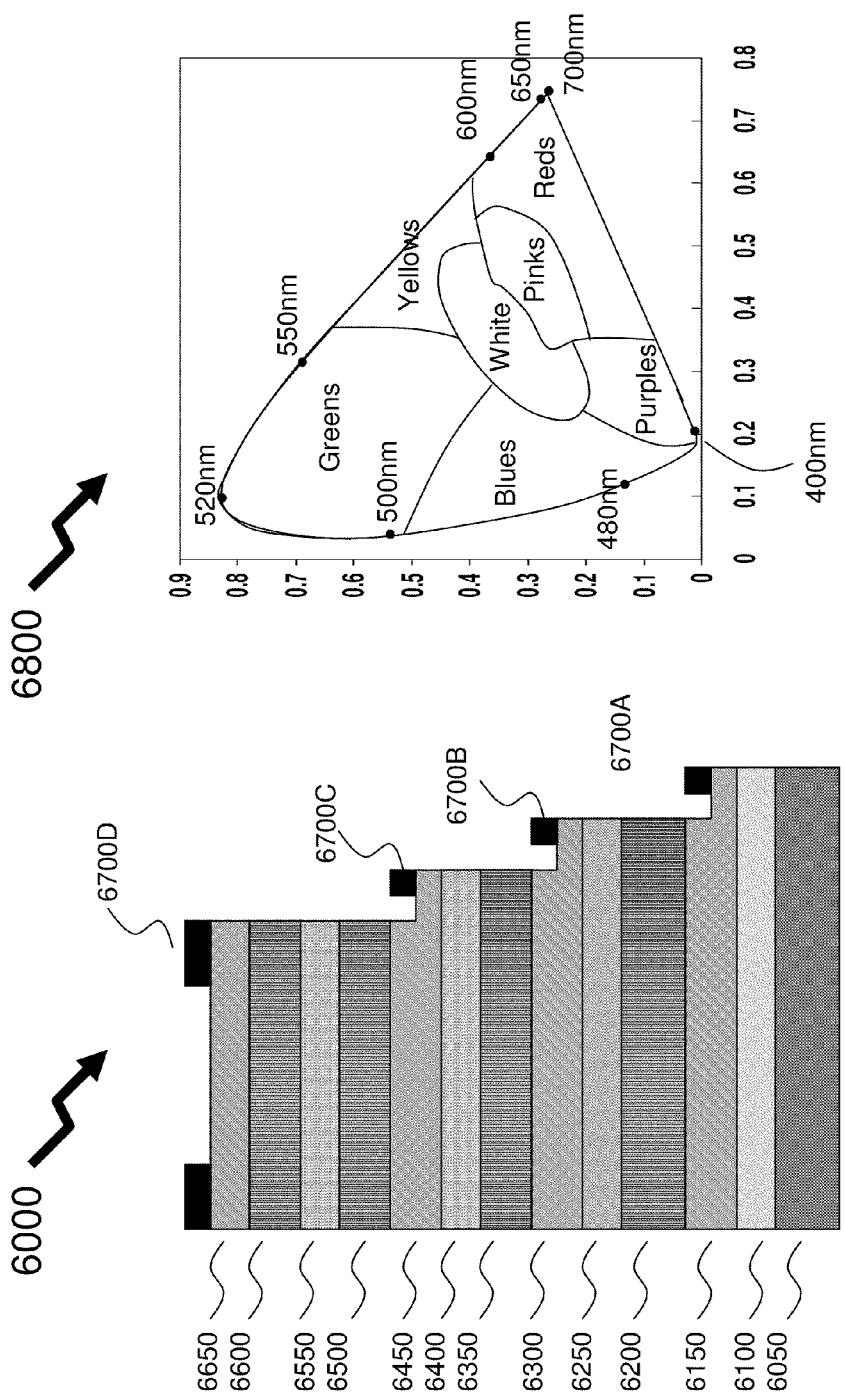
FIG. 6B presents a schematic of a solid state light source according to the prior art of F. G. McIntosh et al in U.S. Pat. No. 5,684,309.

Referring to FIG. 6B there is presented a schematic of a solid state light source 6000 according to the prior art of F. G. McIntosh et al in U.S. Pat. No. 5,684,309 entitled "Stacked Quantum Well Aluminum Indium Gallium Nitride Light Emitting Diodes." Solid state light source 6000 comprises a substrate 6050 upon which is deposited a buffer layer 6100 followed by lower cladding layer 6150 that forms lower contact for a first diode structure comprising first barrier 6200 (AlGaN/AlInGaN) and first active layer 6250 ($In_{X1}Ga_{1-X1}N$). Atop this is second buffer layer 6300 forming lower contact of a second diode structure comprising second active layer 6350 ($In_{X2}Ga_{1-X2}N$), and third barrier 6400 (AlGaN/AlInGaN). Middle cladding layer 6450 forms the lower contact for a third diode structure comprising third barrier layer 6500 (AlGaN/AlInGaN) and third active layer 6550 ($In_{X3}Ga_{1-X3}N$). A fourth barrier layer 6600 (AlGaN/AlInGaN) and top cladding layer 6650 complete the stacked semiconductor structure with top contact 6700D. Each diode structure in the stack having a metal contact 6700A through 6700C formed on the lower contact layers being lower cladding layer 6150, second buffer layer 6300, and middle cladding layer 6450 respectively. Each diode being defined by the percentage of indium within the first through third active layers 6250, 6350 and 6550 respectively, defined as X1, X2, and X3 with corresponding gallium percentages of 1-X1, 1-X2, and 1-X3.

Accordingly solid state light source 6000 operating according to colour theory as shown by CIE-LAB chromaticity plot 6800 which is commonly used for matching colors and determining the result of mixing colours. Single frequency light sources or narrow frequency sources such as LEDs lie on the outside edge of the diagram. Typically to form white light three different colours are used which form a triangle on the CIE-LAB chromaticity plot 6800 and any colour within this triangle can be created by mixing these three "primary" colours. Accordingly by varying each indium concentration X1, X2, and X3 the three diodes act as three different colour sources resulting in the combination being considered as a white light source by a viewer. McIntosh teaching that the resulting devices are preferably formed on a sapphire substrate, which today is typically 2" to 4" in diameter. As would be evident to one skilled in the art providing such solid state light sources on large substrates of silicon or other amorphous materials would be beneficial to reducing the cost of such devices allowing the lowermost crystalline layer to be formed on the amorphous or lattice mismatched substrate before the remainder of the semiconductor structure is grown and processed to form the devices.

Figure 7:
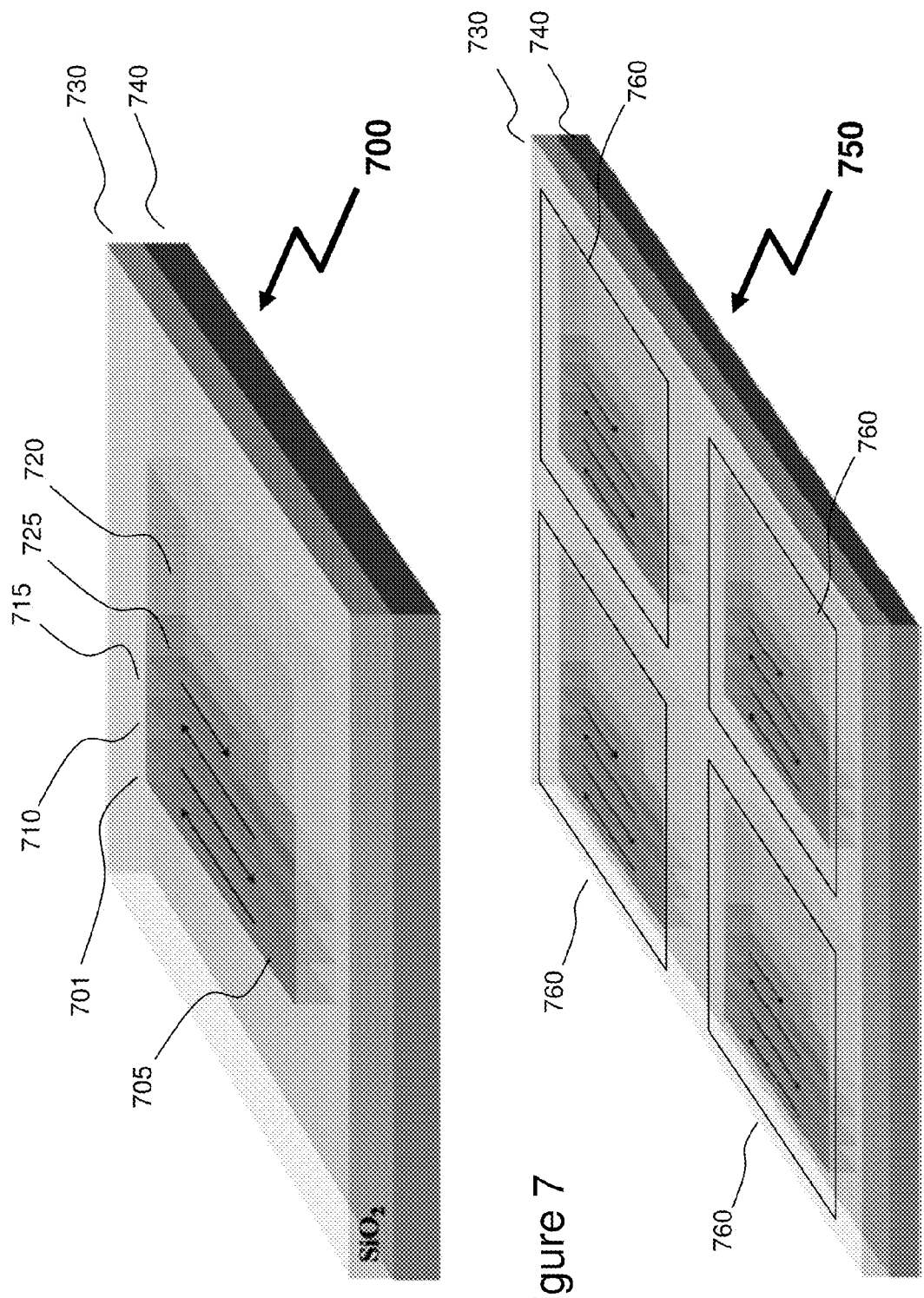
FIG. 7 presents schematics of growth exploiting catalyzed crystalline growth on a mismatched substrate according to an embodiment of the invention.

Referring to FIG. 7 there is presented first schematic 700 of a growth technique according to an embodiment of the invention exploiting catalyzed crystalline growth on a mismatched or amorphous substrate 740. Formed atop the substrate 740 is silicon dioxide 730 that has been patterned to have a region removed exposing the substrate 740 (commonly referred to as a window). Catalyzed crystalline growth, as will be described below according to embodiments of the invention begins with growth of first wire 705 which was initiated at a catalyst nucleation site 701. When the first wire 705 encounters the edge of the window 720 it turns and propagates as second wire 710 adjacent the first wire 705. This sequence repeats giving third wire 715, and as the process is incomplete in partially grown fourth wire 725. Referring to second schematic 750 the growth technique is presented for tiling multiple crystalline regions 760 on a mismatched substrate 740. As with first schematic 700 each crystalline region 760 is defined within a window formed within a layer deposited on the substrate, e.g. silicon dioxide 730. Accordingly each tile is nucleated from a predefined site and propagates as a sequence of wires to fill in each window.

Accordingly the approach may be employed in this repeated adjacent growth of wires to produce a high-quality, single-crystalline film on an amorphous substrate or mismatched substrate. Optionally the material within which the windows are open may be selected from a range of materials including deposited dielectrics such as silicon nitride and silicon oxynitride, spin-on materials such as polyimides, photoresists, etc and spin-on-glasses (SOG) according to the requirements for factors such as selectivity in etching the windows against the substrate and growth parameters. It would also be evident to one skilled in the art that a plurality of discrete crystalline films may also be formed such as depicted below in respect of interconnections between films in FIG. 8B. However, it is also feasible to create isolated crystalline films for specific functions within optical and electronic circuits.

FIG. 8A presents schematics 800A through 800C for exploiting catalyzed crystalline growth on a mismatched or amorphous substrate according to an embodiment of the invention. In this approach in order to cover large areas on amorphous substrates with single crystalline material rather than engineer a nucleation event and grow a wire the approach is to engineer a nucleation event and propagate the nucleated crystal over an ever increasing area. Ideally, there should be one nucleation event in a pre-defined region to ensure a single-crystalline, laterally-grown film. However, where multiple nucleations occur selectivity in growing may ensure that only one orientation is able to laterally grow over the amorphous substrate. Another issue with growing on amorphous substrates is engineering the nucleation location. Amongst methods for predetermined nucleation sites are the use different materials and/or surface structures to enhance nucleation in a particular area, an approach called grapho-epitaxy. First schematic 800A illustrates such a structure where the crystal is likely to nucleate at an acute angle, such as apex 805 in the window 815 formed within the cover layer 810 that is disposed atop the substrate 820. Once the crystal is nucleated, the catalyst size may be increased, for example in many semiconductor processes through exposure to an organometallic source, to widen the growth front and enable ever wider, lateral overgrowth in a predefined area. As shown film 830 initially started at the apex 805 but grew laterally as well as horizontally to fill the taper section of the window 815. Alternatively, the catalyst could be large initially and engineered nucleation could still be limited to the apex.

Second schematic 800B illustrates what continued growth of the crystal in this area might look like with final section 840 being formed after the film 830. To ensure that the semiconductor grows laterally and against the substrate surface, a cover may be added so that the semiconductor grows through a channel, see FIG. 14 below. As with the wire process presented supra in FIG. 7 the lateral growth process may be used to form multiple single crystalline tiles upon an amorphous or mismatched substrate upon which the required devices are subsequently grown and processed. Such an approach being shown in third schematic 800C wherein multiple tiles 850 are formed on the substrate.

It would be evident to one of skill in the art that potential both wire and lateral growth processes may be employed in conjunction with one another to form tiles of complex geometries either with single nucleation sites for each of the wire or lateral growth or multiple nucleation sites. For example consider schematics 800D and 800E in FIG. 8B. In first schematic 800D shown during the growth process a dielectric 860 has a window 865 opened within thereby exposing the substrate (not shown for clarity). At two wire sites 885 nucleation occurs resulting in wires 880 being grown during the growth process whereas from film sites 870 films 875 grow to fill the majority of the window 865. In contrast in second schematic 800E the final grown crystal structure is shown within the dielectric 860B prior to its removal to expose the single crystalline films upon the amorphous or lattice mismatched substrate. In this growth a plurality of films 890 were grown which have been interconnected through first wires 895A within a row and second wires 895B within a column. Accordingly it would be evident to one skilled in the art that films 875 and 890 may be formed from the same of a different material to the wires 880 and 895A/895B according to the device being implemented. Likewise the first and second wires 895A and 895B may be the same or different materials. It would also be evident that nucleation at film sited 870 are depicted as structurally defined whilst wire sites 885 are materially defined that different combinations may be employed according to the desired film geometry whether they are formed from the same material or different materials.

Referring to FIG. 8C there is shown a structurally defined growth process within the vertical domain rather than the horizontal domain. Accordingly in first view 800F there is shown a substrate 8050 having a plurality of structures 8100 formed within it, for example using silicon as substrate 8050 and wet or dry chemical etching to form pyramidal indents as the structures 8100. Second view 800G shows the resulting growth prior and after removal of the dielectric 8150 that was patterned atop the substrate 8050. As shown to the left of second view 800G the grown vertical films 8200 are shown disposed within the dielectric 8150 whilst to the right of the second view 800G the crystalline films 8250 are shown after removal of the dielectric 8150 and hence free standing. It would be evident to someone of skill in the art that the structures 8100 may be formed within a variety of amorphous and lattice-mismatched materials through a variety of physical and chemical processes to provide the desired physical nucleation sites. Alternatively a layer may be patterned onto the substrate prior to the formation of the windowed dielectric such that nucleation based upon material(s) may be initiated to form the vertical crystal growth on the amorphous or lattice-mismatched materials.

Figure 9:
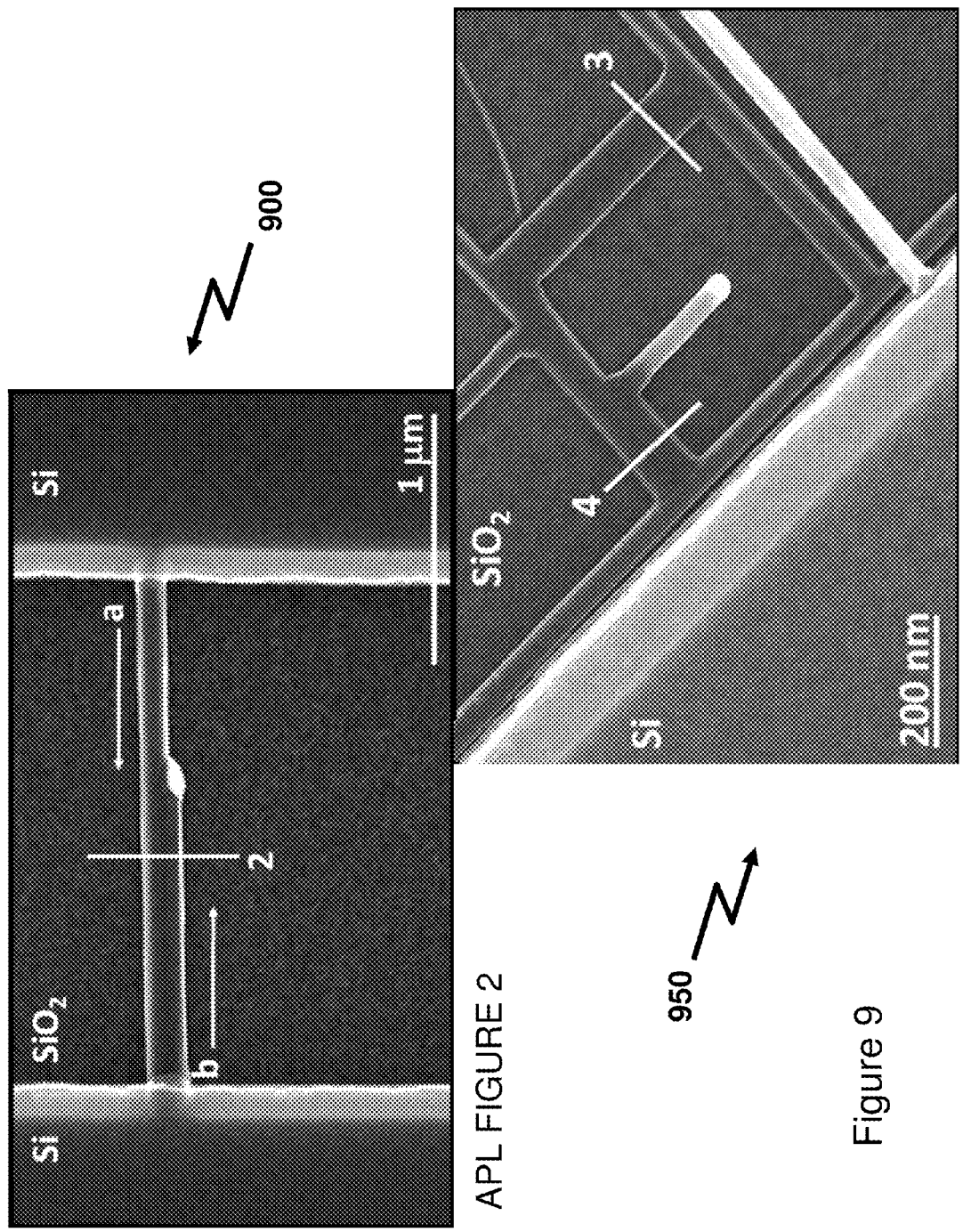
FIG. 9 presents SEM micrographs of catalyzed crystalline growth on a mismatched substrate according to an embodiment of the invention.

Referring to FIG. 9 there are presented SEM micrographs 900 and 950 of catalyzed crystalline growth on a mismatched or amorphous substrate according to an embodiment of the invention. As discussed supra in respect of FIGS. 7 and 8A the technology of controlled nucleation and lateral growth of semiconductor crystalline films can be scaled beyond the micro-scale, wherein crystalline films can be grown, in order to supply the PV/electronics industry with high-quality semiconductors on amorphous substrates covering large areas (important for inexpensive third generation PVs). One approach described in FIG. 7 exploits the ability of these crystalline films to change growth direction based upon encountering a barrier. As shown in FIG. 7 in first schematic 700 with the first wire 705 turning to propagate as second wire 710 upon encountering the edge of the window 720.

Figure 10:
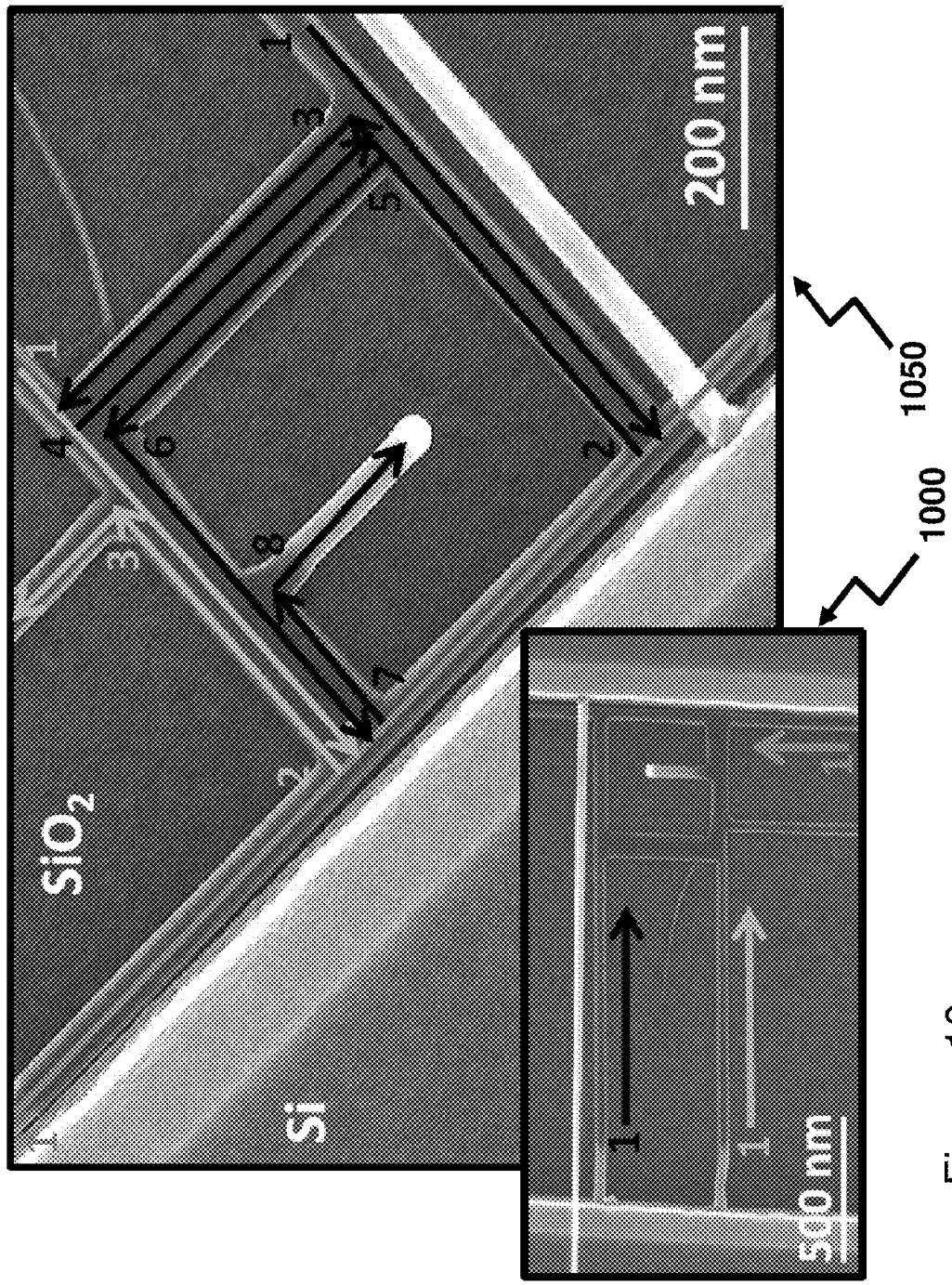
FIG. 10 presents SEM micrographs of catalyzed crystalline growth on a mismatched substrate according to an embodiment of the invention.

Shown in first SEM micrograph 900 there is shown a plan-view image of a similar structure to that depicted in FIG. 7 in first schematic 700 where top Si mesas are on the left and right of first SEM micrograph 900 on either side of a $SiO_2$ undercut region, across which the Si crystalline film is growing across. In first SEM micrograph 900 the crystalline film nucleated on the Si mesa on the right, grew towards the left in the direction of the arrow labeled "a", and then encountered a barrier which caused the crystalline film to grow back towards the right in the direction of arrow "b." The growth in the direction of arrow "b" was done immediately adjacent to the original crystalline film, essentially adding lateral width to the crystalline film. From high-resolution TEM images of the resultant growth the inventor has found that the interface between these two crystalline films is epitaxial and defect free. This adjacent growth phenomena observed in first SEM micrograph 900 and described in FIG. 7 supra provides one route to cover larger areas. Second SEM micrograph 950 shows the process of repeated adjacent growth to grow a high-quality, single-crystalline film over an amorphous substrate, SiO$_2$, wherein the growth is starting to fill in an area, as would be required to cover large areas for PVs or other large-area electronics. In second SEM micrograph 950 there are shown 2 white lines labeled "3" and "4" across regions of the grown Si on SiO$_2$. These numbers represent the number of passes that crystalline films made to achieve the width of the semiconductor intersected by the white lines. FIG. 10 below describes the interaction of three crystalline films which formed the area depicted in second SEM micrograph 950.

Referring to FIG. 10 there are shown first and second SEM micrographs 1000 and 1050 depicting catalyzed crystalline growth on a mismatched substrate according to an embodiment of the invention and show the interaction of three surface Si crystalline films which were grown laterally over the SiO$_2$ surface and begin the process of covering the SiO$_2$ surface with single-crystalline Si. The three crystalline films are depicted over the first SEM micrograph 1000 as arrows in three different grayscales, black (uppermost), dark grey (bottom right) and light grey (lower left). The numbers by the beginning of each arrow indicate the sequence in which the crystalline film grew, for example, in the case of the crystalline film described by the light grey arrow, the crystalline film originated near the number "1" and grew towards right.

Second SEM micrograph 1050 is an image of the upper right portion of first SEM micrograph 1000 at higher magnification and rotated. As such the light grey arrow in the lower left of first SEM micrograph 1000 is similarly shown by light grey "1" and arrow but now starts at the top right of the image and grew towards the bottom left of the figure. (In every case, the grayscale coded number addresses the arrow of the same grayscale, the beginning of which is closest to the number itself.) This crystalline film then encountered the top-Si layer and then made an 180° turn to grow back upon itself following the arrow labeled with a "2." Then, the crystalline film turned 90° to the left and followed the arrow labeled "3" to the top of the image. In a similar manner, the other two crystalline films, black and dark grey crystalline films, growth process is described by numbers and arrows. The dark grey crystalline films having grown from the top left to bottom left. Black crystalline films started from the right and grew diagonally left and down until it encountered the top-Si layer, turned 180° following arrow "2", turned 90° to follow arrow "3", turned 180° to follow arrow "4", turned 180° again to follow arrow "5", turned 90° to follow arrow "6", turned 180° to follow arrow "7" and then turned 90° to follow arrow "8."

Figure 11:
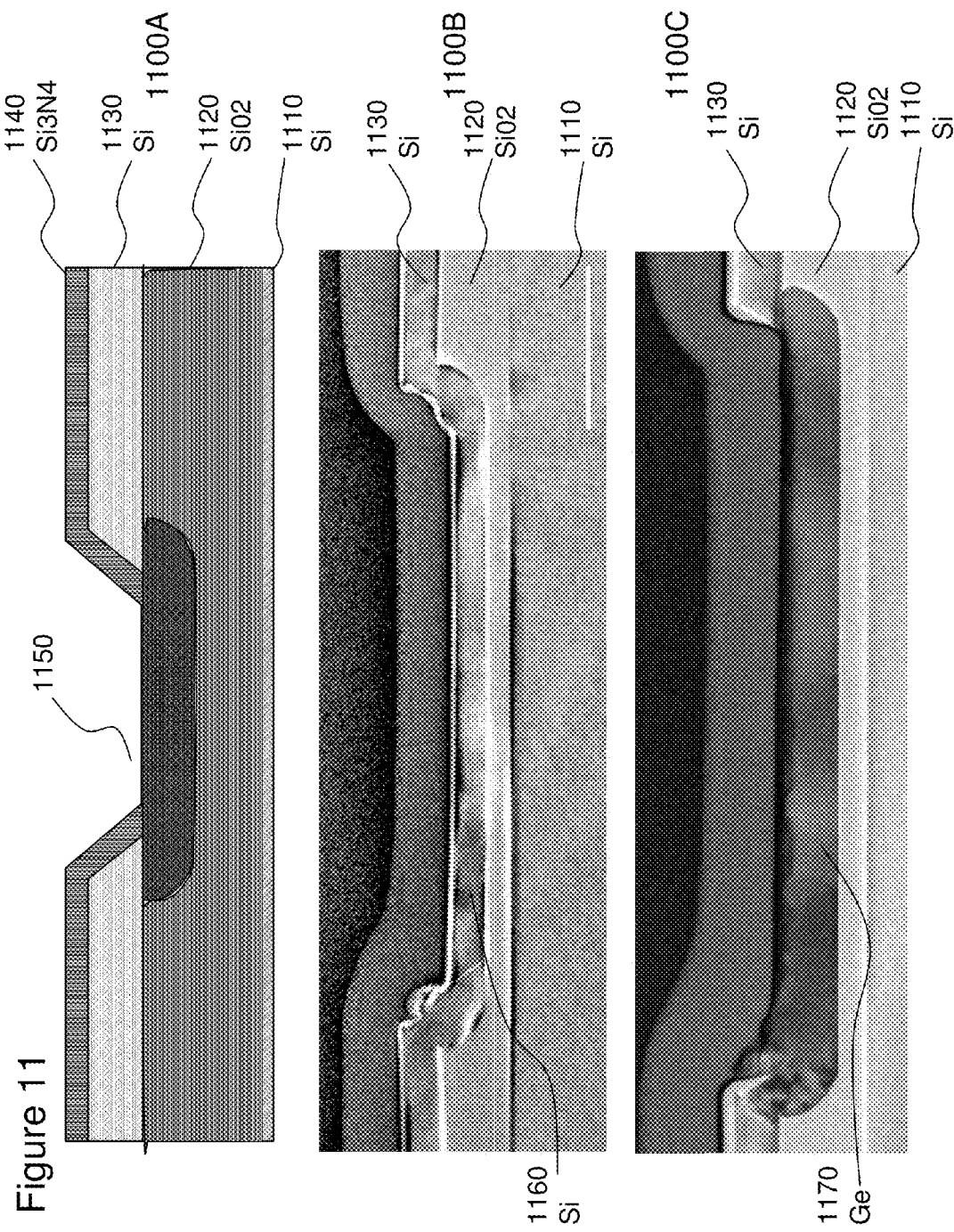
FIG. 11 presents SEM micrographs of catalyzed crystalline growth of Si and Ge upon an amorphous silica layer according to an embodiment of the invention.

Now referring to FIG. 11 there is shown a schematic cross-section 1100A and first and second transmission electron micrographs (TEM) 1100B and 1100C of catalyzed crystalline growth of Si and Ge upon an amorphous silica layer respectively according to an embodiment of the invention. Considering schematic cross-section 1100A then there is shown an underlying Si substrate 1110 atop which has been formed a SiO$_2$ layer 1120 and a Si film 1130. The Si film 1130 have been patterned and coated with Si$_3$N$_4$ 1140. The SiO$_2$ layer 1120 having then been etched through the opening within the Si 1130 and Si$_3$N$_4$ 1140. Finally the crystalline films 1150 has been grown through nucleation catalysed at the underside exposed surface of the Si 1130 which was exposed through undercut in the SiO$_2$ etching step.

First TEM micrograph 1100B shows high-quality Si 1160 grown laterally over SiO$_2$ 1120 in a $\vec{g}$=<220>, diffraction-contrast, transmission-electron micrograph (TEM). This diffraction condition highlights defects within the semiconductor. This high-quality material was grown across the SiO$_2$ 1120 surface using the structure described above in respect of schematic 1100A. Also evident in the first TEM micrograph 1100B is the silicon substrate 1110 used in these initial growths. Second TEM micrograph 1100B shows high quality Ge 1170 grown on the SiO$_2$ 1120. In each instance the Si and Ge crystalline films nucleate on the top Si layer 1120 and grew from this nucleation point towards the right along the oxide surface. In the process of growing, and possibly because the growth direction changes from <111> to <110>, there are some crystal defects on the left-side of each crystalline film. As the crystalline film grows towards the right, however, these defects neck-out of the crystalline film and result in defect-free crystalline films. High-quality Ge grown on SiO$_2$ is particularly interesting because Ge is one of the standard substrates upon which high-efficiency, multi-junction PVs are made. It would be evident that whilst silicon was used as the substrate 1110 in these experiments that it may be glass or another material atop which an amorphous SiO$_2$ layer 1120 is formed.

Fabrication of the catalyzed crystalline growth of Si upon an amorphous silica layer as depicted supra in respect of first TEM 1100B according to an embodiment of the invention started with a silicon-on-insulator (SOI) substrate consisting of a 100 nm thick, (100)-oriented, n+ Si layer (Si film 1130) on a 200 nm buried oxide (BOX, SiO2 layer 1120) on a p– Si wafer (Si substrate 1110). The n+ Si layer (Si film 1130) was etched with KOH initially and then a 70 nm Si3N4 1140 layer was deposited on the n+ Si and patterned using anisotropic reactive ion etching (RIE) to cover the KOH etched Si sidewalls with Si3N4 1140 prior to Si growth. The BOX oxide was then etched with 10:1 NH4F:HF (BOE) to undercut the top n+– Si layer. The silicon 1160 was grown using the vapor-liquid-solid (VLS) mechanism (see for example R. Wagner et al, Appl. Phys. Lett. 1964, Iss. 4, pp. 89-90) enabled by depositing reformed, 40 nm, colloidal Au nanoparticles only on exposed Si surfaces. Accordingly, the only exposed Si surfaces were those exposed by the BOE on the underside of the n+ Si layer (Si layer 1130).

This selective placement of Au was engineered by first exposing the entire structure to a mixture of 40 nm Au colloid and HF to deposit Au nanoparticles everywhere. The sample was then annealed at 400° C. in a H2 ambients above the Au/Si eutectic temperature (363° C.) so that those Au nanoparticles in contact with Si alloyed with the Si, typically 1 standard liter per min (slm) for 5 minutes at a pressure of 95 Torr. Those Au nanoparticles on the oxide and nitride surfaces did not alloy were then removed by dipping the sample in BOE for 7 seconds and H3PO4 (at 155° C.) for 2.5 minutes to etch some of the oxide and nitride, respectively. This etching resulted in Au nanoparticles remaining only on exposed Si surfaces, namely, the KOH etched surface and the undercut Si surface. The silicon 1160 was then grown under conditions of 680° C. at 95 Torr using 3.7 standard cubic centimeters per minute (sccm) SiH4 and HCl in a H2 ambient of 3 slm.

With respect to catalyzed crystalline growth of Ge upon an amorphous silica layer as depicted supra in respect of second TEM 1100C according to an embodiment of the invention then the manufacturing sequence proceeded along the same process flow as described supra in respect of catalyzed crystalline growth of Si upon an amorphous silica layer (first TEM 1100B) with the exception that the sample was annealed again for 10 minutes at 700° C. at 95 Torr while flowing 1 slm $H_2$ after BOE/H3PO4 etching before the Ge 1170 was grown at 337° C. with 1 slm H2 and 95 sccm 2% $GeH_4$ (balance $H_2$), at 95 Torr. Subsequent to growth of Ge 1170 or Si 1160 file the sample was dipped in Transene TFA gold etch:HCl at a ratio of 9:1 for 2 min to remove the gold nanoparticles.

Figure 12:
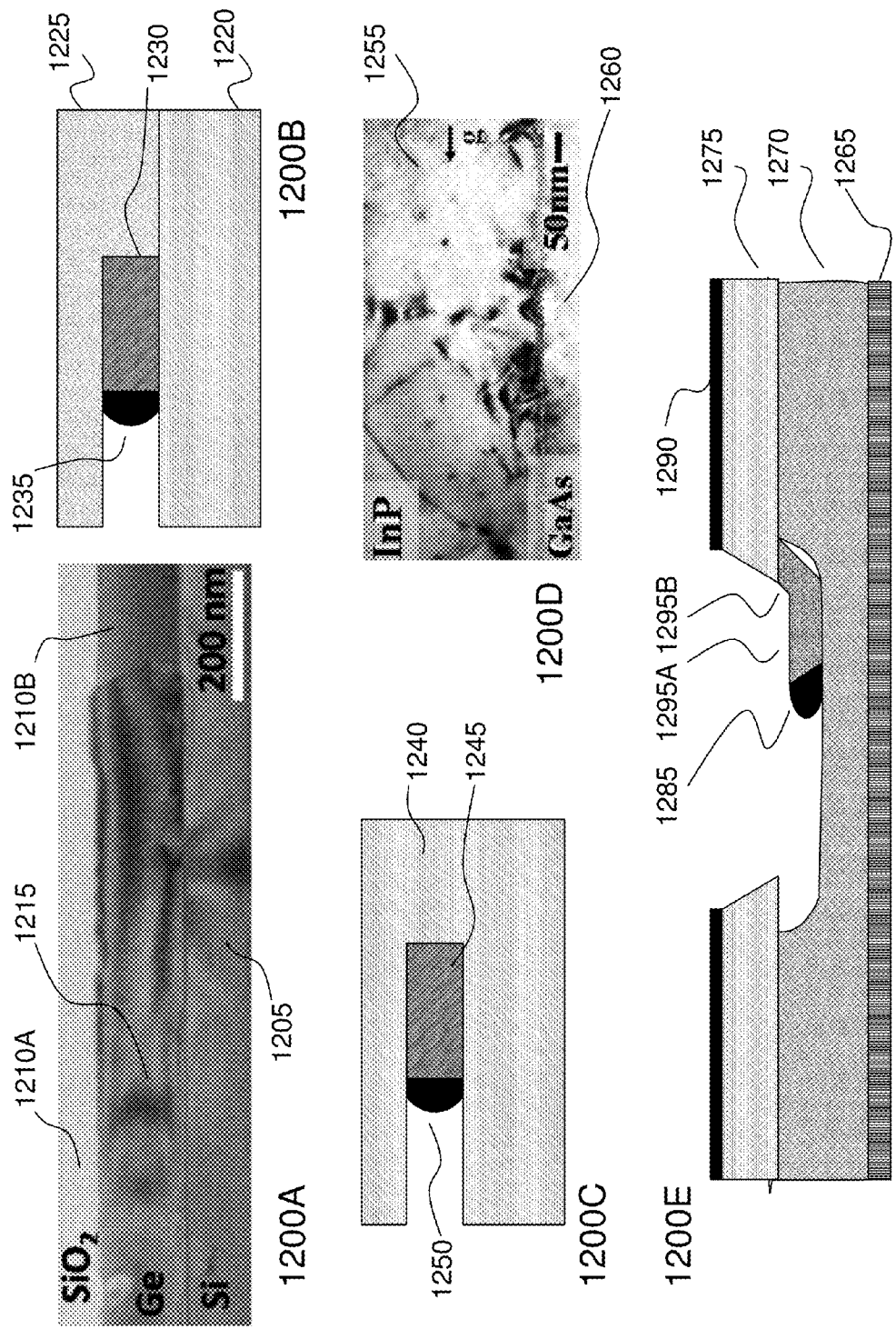
FIG. 12 presents SEM micrographs of catalyzed crystalline growth of Ge on Si and InP and GaAs according to embodiments of the invention.

Referring to FIG. 12 there are depicted TEM micrograph 1200A of catalyzed crystalline growth of Ge on Si according to an embodiment of the invention shown in schematics 1200B and 1200C respectively. TEM micrograph 1200D showing a conventional semiconductor growth of lattice-mismatched InP on GaAs. As discussed supra the embodiments of the invention are based upon the lateral growth of films and engineering of one nucleation site which is enabled through the use of guided, selective, metal-catalyzed CVD growth. Since the coalescence of two films creates a grain boundary, selectivity is required to ensure one nucleation site for each film. Using this approach, a high-quality, lattice-mismatched material can be grown directly onto a substrate, e.g. Ge on Si, using crystalline films as can be seen in TEM micrograph 1200A. In fact, the quality of the Ge crystalline film on Si is noticeably better than that of an InP film grown directly on GaAs as see in TEM micrograph 1200D by conventional prior art techniques. As shown in TEM micrograph 1200A there is shown substrate 1205, silicon oxide 1210B and overlay silicon dioxide 1210A which form the structure for growth of the Ge crystalline films 1215.

To guide the growth laterally, the catalyst in many embodiments of the invention benefits from being a liquid at growth conditions and according a structure engineered such as depicted in TEM micrograph 1200A and first and second schematics 1200B and 1200C. In first schematic 1200B the substrate 1220 has a $SiO_2$ structure 1225 formed upon it that forms the required structure to keep the catalyst in contact with the surface since in many material systems the crystalline films typically grow away from the surface. The catalyst 1235 thereby moving along the structure as the crystalline films 1230 grows. The catalyst would be placed in the guiding channel and be exposed to reactant gases causing, in this case, Ge to grow along the substrate surface. Second schematic 1200C shows a similar structure, one that can grow high-quality films on amorphous substrates, with an amorphous structure 1240 with liquid catalyst 1250 and crystalline films 1245 growing behind. It would be apparent to one skilled in the art that the catalyst may be either liquid or solid during the growth of the crystalline film according to embodiments of the invention. Alternatively providing a structure such as shown in first and second schematics 1200B and 1200C may result in an increased concentration of a material in gaseous form that triggers catalysis of the material growth within such structures.

As noted supra there is a tendency for crystalline films to grow away from the surface. Amongst the techniques are those based upon the physical structures as depicted in first and second schematics 1200B and 1200C but it is also possible to exploit the crystal structure to direct the growth towards the substrate surface. Such a structure being shown in schematic 1200E wherein an underlay 1265 has a layer 1270 formed upon it with an opening in the surface that was etched after patterning the upper layer 1275 in combination with mask 1290. The crystalline films being formed from first section 1295B that grows towards the substrate from the lower surface of the upper layer 1275 until it contacts it and grows as second section 1295A.

Figure 13:
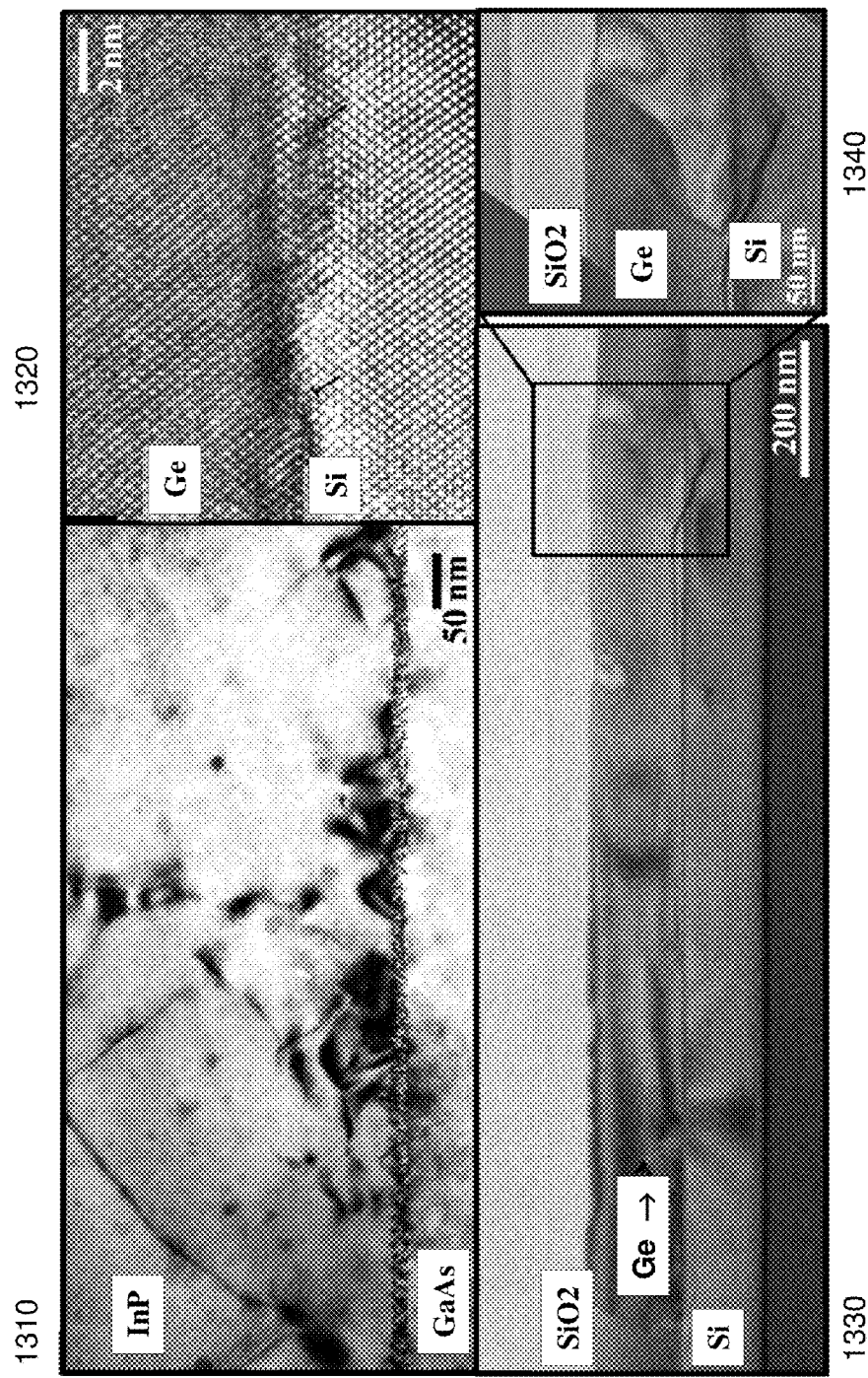
FIG. 13 presents SEM micrographs of catalyzed crystalline growth of Ge on Si and InP on GaAs according to embodiments of the invention.

In addition to growing high-quality semiconductors on amorphous substrates, engineered nucleation and lateral growth of semiconductors can be used to grow high-quality material on lattice-mismatched substrates. This technology is also important in PVs since high-efficiency triple-junction PVs need band gaps around 0.7, 1.2 and 1.8 eV which are not available at any single lattice constant with the same materials system (see FIG. 4). When growing planar, lattice-mismatched films, threading dislocations are nucleated from the ambient/film surface (film surface) and glide downward to the film/substrate interface to relieve the lattice-mismatch strain after a critical thickness is achieved. Dislocations are recombination centers for minority carriers and degrade majority-carrier devices and can inhibit the operation of minority-carrier devices. As a result of lattice-mismatched, planar growth, the film surface, upon which the device is made, has numerous threading dislocations which reduces or prohibits the functionality of devices built upon the film. An example of such a planar, lattice-mismatched film is shown in FIG. 13 in TEM micrograph 1310 in which InP is grown directly on GaAs. By contrast the prior art for such structures for InP on GaAs requires multiple graded buffer layers selected from the InGaAs, InGaP, InAlAs, and InGaAlAs materials systems, see for example N. Quitoriano et al in "Relaxed High Quality InP on GaAs by using InGaAs and InGaP Graded Buffers to Avoid Phase Separation" (J. Appl. Phys., 102, August 2007, pp. 033511-033511-17).s This direct-growth of an approximately 4% lattice-mismatched film results in a threading dislocation density on the order of $10^8/cm^2$. The lateral growth of semiconductors, however, provides a path to circumvent the need to nucleate dislocations from the film surface, since dislocations can more easily nucleate from the crystalline films edge as the crystalline film grows laterally over the substrate surface. In this way, dislocations will not intersect the top of the crystalline films, where defect-sensitive devices would be made. TEM micrograph 1330 in FIG. 13 shows Ge crystalline films, laterally grown over a Si substrate, also representing an approximate 4% lattice mismatch. Both TEM micrographs 1310 and 1330 were taken in a $\vec{g}$=<220> diffraction condition with more threading dislocations intersecting the top surface in TEM micrograph 1310 (three) than in TEM micrograph 1330 (zero).

Lateral, metal-catalyzed, semiconductor growth has been demonstrated over lattice-matched, single-crystalline substrates, see for example Mikkelsen et al in "The Influence of Lysine on InP(001) Surface Ordering and Nanowire Growth" (Nanotechnology, Vol. 16, No. 10, pp 2354-) have reported Au-catalyzed InP growth against InP substrates in <110>-type directions. Importantly in this prior art there is no lattice mismatch between the substrate and the adjacent crystalline film. TEM micrograph 1330 in FIG. 13 with the Ge crystalline film grown laterally across a Si substrate is a 4% lattice mismatch and yet is still of high-quality. Unlike with the work by Mikkelsen et al, Ge crystalline films on Si typically grow with a component perpendicular to the substrate surface and so do not naturally grow laterally over the substrate surface. However, here the crystalline films was compelled to grow laterally over the substrate surface because of the $SiO_2$, capping layer, shown as TEM micrograph 1330 in FIG. 13. These crystalline films grew over 1 μm from left to right. On the right side of the figure, there is a dislocation present; however, this dislocation does not intersect the Ge/$SiO_2$ interface and may be a misfit dislocation at the Si/Ge interface. Misfit dislocations are visible in the high-resolution micrograph in TEM micrograph 1320 in FIG. 13 where two misfits are present and marked with a "⊥" to aid the eye. Seem micrograph 1340 in FIG. 13 highlights the right side of this image and both TEM micrographs 1320 and 1340 were taken after the Au catalyst was removed with a Transene Au etch.

Figure 14:
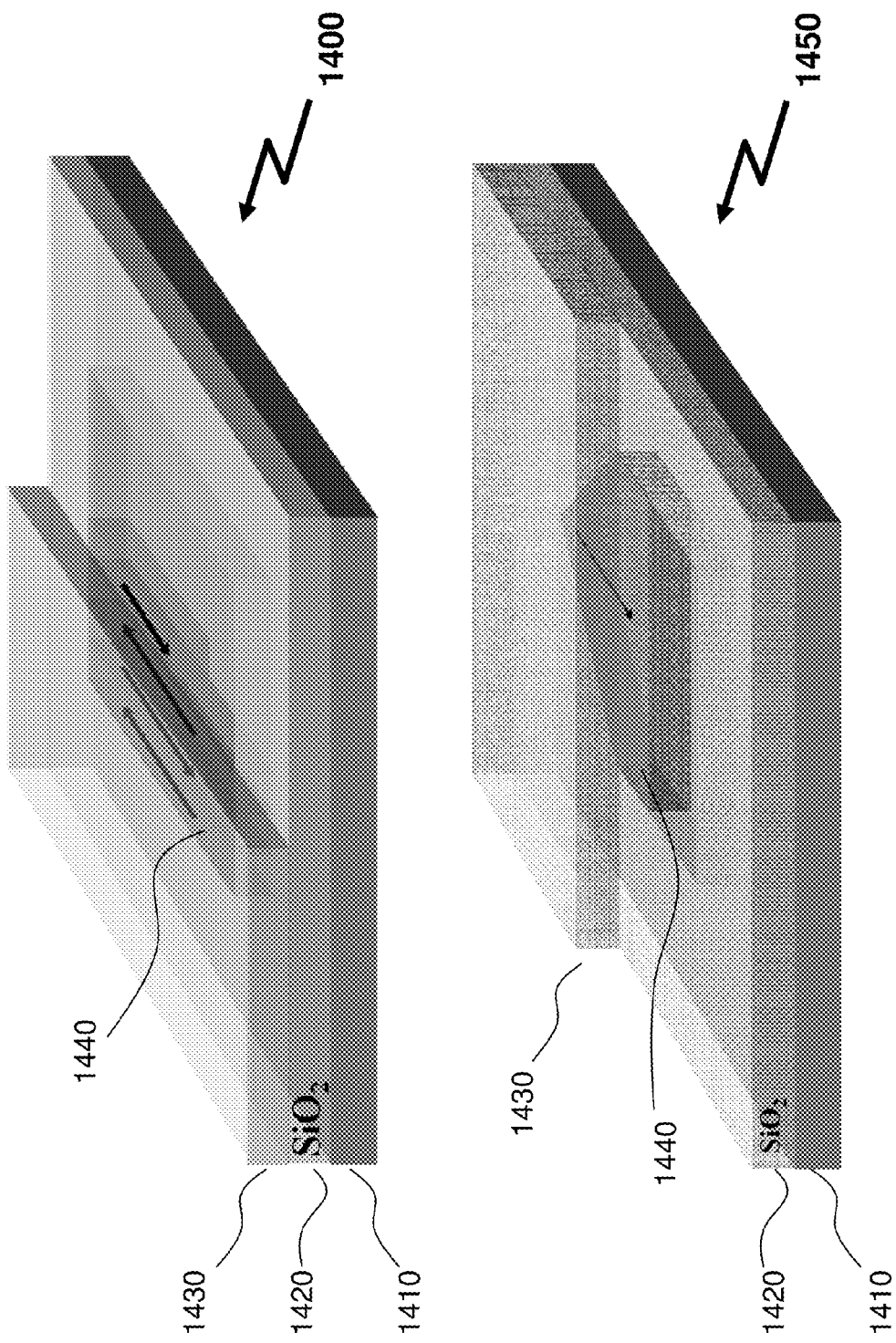
FIG. 14 presents schematics of growth exploiting catalyzed crystalline growth on a mismatched substrate according to an embodiment of the invention.

Referring to FIG. 14 there are presented schematics of growth exploiting catalyzed crystalline growth on a mismatched substrate according to an embodiment of the invention. First schematic 1400 depicts an addition of an oxide layer 1430 covering the semiconductor growth. This oxide layer 1430 cover may be required to keep the growth planar, against the substrate 1410 surface with the crystalline films growth laterally confined by the window formed in the dielectric 1420. This process is similar to that reported by the inventor in "Guiding Vapor-Liquid-Solid Nanowire Growth using SiO2" (Nanotechnology, Vol 20, 145303) in growing Si crystalline films from the surface of a silicon substrate through small channels whose walls were made with $SiO_2$.

Whilst this type of structure may not be made easily completely with $SiO_2$ replacing the top-amorphous layer 1430 with a different material, say $Si_3N_4$, then selective etch chemistry can be used to make this structure. Schematic 1450 in FIG. 14 depicts the process described in FIG. 8A supra with the addition of a dielectric layer 1430 covering the semiconductor growth. This dielectric cover may be required to keep the growth against the surface of the substrate 1410 with the growing crystal 1440 as has been depicted within exemplary growths in FIGS. 11 through 13.

Figure 15:
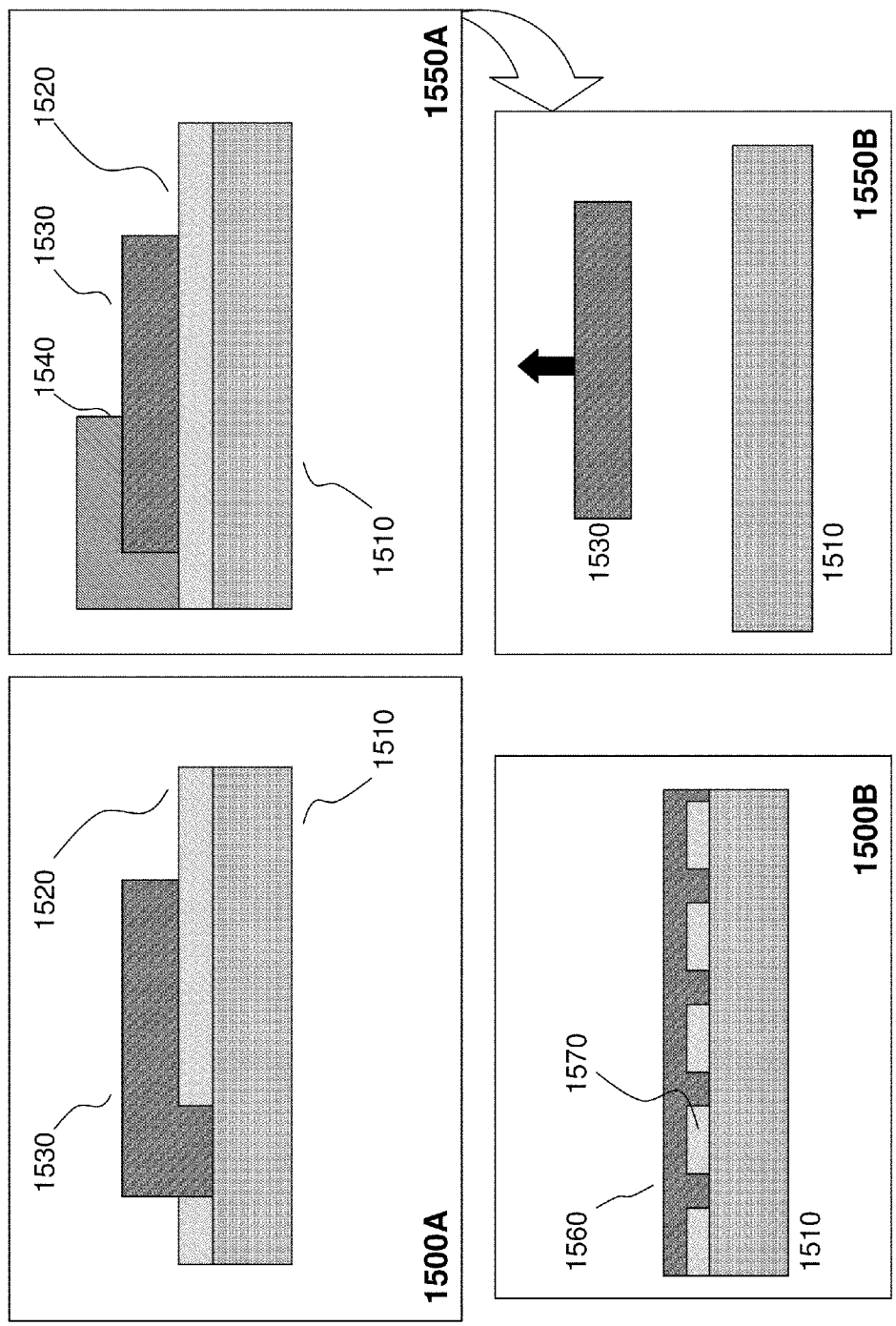
FIG. 15 presents schematics of growth exploiting catalyzed crystalline growth on amorphous materials for epitaxial layer over-growth or lift-off according to an embodiment of the invention.

Now referring to FIG. 15 there are shown first and second schematics 1500A and 1550A for growing a crystalline layer 1530 over an amorphous layer 1520 on a substrate 1510. In first schematic 1500A a substrate 1510 has an amorphous layer 1520 grown over the top and patterned to create an opening within. Subsequently catalyzed growth of the epitaxial layer 1530 is undertaken at the opening within the amorphous layer 1520 such that the epitaxial layer 1530 grows atop the amorphous layer 1520. In second schematic 1550A a structure similar to the first schematic 1200B in FIG. 12 is presented wherein catalyzed growth of the epitaxial layer 1530 occurs initially within the structure formed by amorphous layer 1520 and capping layer 1540, all of these layers being atop the substrate 1510.

Accordingly each of first and second schematics 1500A and 1550B present approaches to catalyzed epitaxial layer overgrowth (CELO). Consider first schematic 1500A then in essence the underlying substrate 1510 is used as a seed and template for a crystalline layer, epitaxial layer 1520, that is grown over a buffer layer, amorphous layer 1520. The benefits of CELO are that the overgrown layer(s) can be much larger than achieved with epitaxial layer overgrowth (ELO) according to the prior art, see for example J. Fiorenza et al in US Patent Application 2010/0216277 entitled "Formation of Devices by Epitaxial Layer Overgrowth", Y. Miyai in "Epitaxial Lateral Overgrowth (ELO) of Silicon on the Whole Surface" (Jpn. J. Appl. Phys. 27 (1988) pp. 1536-1537), and E. Feltin et al in "Epitaxial Lateral Overgrowth of GaN on Si (111)" (J. Appl. Phys., Vol. 93, Iss. 1, 182 (2003), 4 pages).

ELO growth is typically limited by the diffusion length of gas species on the amorphous material in order to prevent nucleation on the amorphous material and subsequent random growth and grain boundaries due to coalescence. In CELO as the layers grow with significantly reduced cracking on the substrate, due to lower growth temperature, the area that CELO can cover is larger than the areas of the prior art. Another advantage is that when catalyzed growth material coalesces into another similarly oriented substrate, the interface appears to be of good quality, see for example N. Quitoriano et al in "Integratable Nanowire Transistors" (Nano Letters, Vol. 8, No. 12, p 4410, 2008). This suggests that there may not be a limit in size of the overgrown material because good-quality coalescence is possible. Third schematic. 1500B, shows the prior art of Feltin wherein a GaN layer 1560 was grown on silicon (111), substrate 1510, with films of thickness below 3 μm wherein the intermediate layer 1570 was Si3N4 and 3 μm openings were formed with a period of 10 μm. However this growth was still at a very high temperature (1120° C.) in order to achieve a fast lateral growth rate. Fiorenza teaches further that the maximum lateral overgrowth length may be limited by the maximum allowable thickness of the film as unlike CELO the growth is three-dimensional.

Accordingly Fiorenza teaches that the overgrowth length may be increased by repeatedly thinning the grown film and re-growing such that the overgrowth length is increased. Clearly such multiple chemomechanical or chemical processing steps are disadvantageous in low cost manufacturing and hence even if a film of only 100 μm width is required with a maximum thickness 1 μm with even growing in 10 μm steps 10 such growth-etching steps are required or 99 μm of material must be removed. Finally in fourth schematic 1550B an epitaxial lift-off process is shown allowing the grown film, epitaxial layer 1530, to be removed from the substrate 1510 by sacrificial etching of the amorphous layer 1520. Accordingly ultra-thin crystalline devices can be fabricated through the CELO process to form their substrate and then removed from the carrier substrate 1510.

First and second schematics 1500A and 1550A in FIG. 15 allow the growth of large crystalline layers, epitaxial layer 1530, as the amorphous layer 1520 does not promote cracking of the growth gas species and inhibits nucleation. An example of such materials are amorphous materials as described in the embodiments but it would evident to one of skill in the art that other materials may provide the same inhibition of gas cracking and nucleation. Amongst suitable amorphous materials to provide the amorphous layer 1520 are silicon oxide, silicon nitride, amorphous metals, hafnium oxide, titanium nitride, zinc oxide, as well as other various oxides and nitrides.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:
1. A method comprising:
providing an amorphous substrate of a first material;
providing a crystalline planar film of a second material grown directly onto the amorphous substrate of the first material using a catalyzed growth process absent any prior deposition of a planar film of the second material; wherein
the crystalline planar film is grown using a structure formed upon the amorphous substrate that maintains contact of a catalyst employed within the catalyzed growth process with the amorphous substrate; and
the crystalline planar film of the second material has a width and a length predominantly larger than its thickness.
2. The method according to claim 1, wherein
at least one of:
the crystalline planar film grows laterally across the amorphous substrate and only grows at the exposed edges of the crystalline planar film; and
the catalysed growth at least one of controls the location of the film on the substrate and employs a metal as a catalyst.

3. The method according to claim 1, wherein
at least one of:
the first material is silicon dioxide and the second material is germanium;
the catalyzed growth process employs a metal as the catalyst which is in liquid form under the growth conditions of the catalyzed growth process.

4. A method comprising:
providing a crystalline substrate of a first material;
providing a crystalline planar film of a second material directly onto the crystalline substrate of the first material using a catalyzed growth process absent any prior deposition of a planar film of the second material; wherein
the crystalline planar film is grown using a structure formed upon the crystalline substrate that maintains contact of a catalyst employed within the catalyzed growth process with the crystalline substrate; and
the crystalline planar film of the second material has a width and a length predominantly larger than its thickness.

5. The method according to claim 4, wherein
the crystalline planar film grows laterally across the crystalline substrate, only grows at the exposed edges of the crystalline planar film, and dislocations nucleate preferentially from the crystalline planar film edge such that these dislocations do not intersect the crystalline planar film surface.

6. The method according to claim 4, wherein
the catalyzed growth process employs a metal as the catalyst which is in liquid form under the growth conditions of the catalyzed growth process.

7. A method comprising:
(a) providing a substrate of a first material, the first material having an amorphous structure;
(b) providing a nucleation site at a predetermined location using a structure formed upon the substrate that maintains contact with the substrate of a catalyst employed within a catalyzed growth process of a crystalline planar film of a second material on the substrate;
(c) establishing predetermined environmental conditions for the catalyzed growth process of the crystalline planar film of the second material; and
(d) growing only from the nucleation site the crystalline planar film of the second material, wherein
the crystalline planar film of the second material has a width and a length predominantly larger than its thickness.

8. The method according to claim 7, wherein
the crystalline planar film grows laterally across the amorphous substrate, only grows at the exposed edges of the crystalline planar film, and dislocations nucleate preferentially from the crystalline planar film edge such that these dislocations do not intersect the crystalline planar film surface.

9. The method according to claim 7, further comprising;
in step (b) depositing a predetermined material within a predetermined region of the nucleation site; and
in step (c) providing a substrate temperature such that the predetermined material is a liquid during the initiation of growth, wherein the substrate temperature is below the temperature at which the second material melts.

10. The method according to claim 7, wherein
the catalyzed growth process employs a metal as the catalyst which is in liquid form under the predetermined environmental conditions of the catalyzed growth process.

11. The method according to claim 7, wherein
step (b) comprises providing a predetermined physical structure as the nucleation site within the substrate.

12. The method according to claim 7, wherein
the structure comprises a first region formed from a third material upon a first predetermined portion of substrate of the first material and a second region formed from a fourth material disposed such that a first predetermined portion of the second region covers the first region and a second predetermined portion of the second region covers a second predetermined portion of the substrate of the first material adjacent the first predetermined portion of the substrate of the first material; wherein
the catalyzed growth process of the crystalline planar film of the second material begins at the nucleation site and progresses within the region between the second predetermined portion of the second region and the substrate of the first material.

13. A method comprising:
(a) providing a substrate of a first material, the first material having a crystalline structure;
(b) providing a nucleation site at a predetermined location using a structure formed upon the substrate that maintains contact with the substrate of a catalyst employed within a catalyzed growth process of a crystalline planar film of a second material;
(c) establishing predetermined environmental conditions for the catalyzed growth process of the crystalline planar film of the second material; and
(d) growing only from the nucleation site the crystalline planar film of the second material, wherein
the grown crystalline planar film of the second material has a width and a length predominantly larger than its thickness.

14. The method according to claim 13, wherein
step (b) comprises providing a predetermined physical structure as the nucleation site within the substrate.

15. The method according to claim 13, wherein
the catalyzed growth process employs a metal as the catalyst which is in liquid form under the predetermined environmental conditions of the catalyzed growth process.

16. The method according to claim 13, further comprising
in step (b) depositing a predetermined material within a predetermined region of the nucleation site; and
in step (c) providing a substrate temperature such that the predetermined material is a liquid during the initiation of growth, wherein the substrate temperature is below the temperature at which the second material melts.

17. The method according to claim 13, wherein
the crystalline planar film grows laterally across the crystalline substrate, only grows at the exposed edges of the crystalline planar film, and dislocations nucleate preferentially from the crystalline planar film edge such that these dislocations do not intersect the crystalline planar film surface.

18. The method according to claim 13, wherein
the structure comprises a first region formed from a third material upon a first predetermined portion of substrate of the first material and a second region formed from a fourth material disposed such that a first predetermined portion of the second region covers the first region and a second predetermined portion of the second region covers a second predetermined portion of the substrate of the first material adjacent the first predetermined portion of the substrate of the first material; wherein the catalyzed growth process of the crystalline planar film of the second material begins at the nucleation site and progresses within the region between the second predetermined portion of the second region and the substrate of the first material.

19. The method according to claim 13, wherein step (b) comprises providing as a predetermined portion of the nucleation site a physical structure, the physical structure promoting growth of the crystalline second material under the predetermined environmental conditions.

20. A method comprising:
providing an amorphous layer of a first material atop a substrate;
providing a first crystalline planar film of a second material atop the first material;
patterning the first crystalline planar film of the second material to form an opening;
patterning the amorphous layer of the first material through the opening in the second material in order to establish a predetermined physical structure along a predetermined portion of the opening in the second material;
growing from the first crystalline planar film of the second material at a predetermined location within the predetermined physical structure across a predetermined portion of a surface established from the patterning of the amorphous layer of the first material a second crystalline planar film of the second material via catalyzed growth process; wherein
the crystalline planar film of the second material has a width and a length predominantly larger than its thickness.

21. The method according to claim 20, wherein
the predetermined physical structure is an undercutting of the amorphous layer of the first material with respect to the crystalline planar film of the second material; and
the crystal structure of the second material directs the catalyzed growth process to the surface established from the patterning of the amorphous layer of the first material.

22. The method according to claim 20, wherein
the surface is the first material or the substrate.

23. The method according to claim 20, wherein
the catalyzed growth process employs a metal as the catalyst which is in liquid form under the growth conditions of the catalyzed growth process.

24. The method according to claim 20, wherein
the catalyzed growth process employs a nucleation site established by placement of a metal catalyst upon an exposed lower surface of a portion of the crystalline second material forming part of the physical structure.

25. A method comprising:
providing a layer of a first material, the first material being silicon dioxide;
providing a first crystalline planar film of a second material atop the first material;
patterning the first crystalline planar film of the second material to form an opening;
patterning the layer of the first material through the opening in the second material in order to establish a predetermined physical structure along a predetermined portion of the opening in the second material;
growing from the first crystalline planar film of the second material at a predetermined location within the predetermined physical structure across a predetermined portion of a surface established from the patterning of the layer of the first material a second crystalline planar film of the second material having a width and a length predominantly larger than its thickness via a catalyzed growth process.

26. The method according to claim 25, wherein
the predetermined physical structure is an undercutting of the crystalline layer of the first material with respect to the crystalline planar film of the second material; and
the crystal structure of the second material directs the catalyzed growth process to the surface established from the patterning of the amorphous layer of the first material.

27. The method according to claim 25, wherein
the surface is the first material or a substrate upon which the first material was grown.

28. The method according to claim 25, wherein
the catalyzed growth process employs a metal as the catalyst which is in liquid form under the growth conditions of the catalyzed growth process.

29. The method according to claim 25, wherein
the catalyzed growth process employs a nucleation site established by placement of a metal catalyst upon an exposed lower surface of a portion of the crystalline second material forming part of the physical structure.

* * * * *